(12) United States Patent
Park et al.

(10) Patent No.: US 10,522,608 B2
(45) Date of Patent: Dec. 31, 2019

(54) DISPLAY DEVICE

(71) Applicant: SAMSUNG DISPLAY CO., LTD., Yongin-si, Gyeonggi-do (KR)

(72) Inventors: Kyong Tae Park, Suwon-si (KR); Chul-Hwan Park, Asan-si (KR); Sun-Kyo Jung, Cheonan-si (KR); Sung Ho Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/831,893

(22) Filed: Dec. 5, 2017

(65) Prior Publication Data

US 2018/0158894 A1 Jun. 7, 2018

(30) Foreign Application Priority Data

Dec. 6, 2016 (KR) .......................... 10-2016-0165137

(51) Int. Cl.
*H01L 27/32* (2006.01)
*H01L 51/52* (2006.01)
*H01L 51/00* (2006.01)

(52) U.S. Cl.
CPC ...... *H01L 27/3276* (2013.01); *H01L 51/0031* (2013.01); *H01L 51/5253* (2013.01); *H01L 51/5256* (2013.01); *H01L 27/323* (2013.01); *H01L 2251/5338* (2013.01)

(58) Field of Classification Search
CPC ............. H01L 27/3276; H01L 51/5256; H01L 2251/5338; H01L 27/323; H01L 51/0031; H01L 51/5253

USPC ........................................................... 257/48
See application file for complete search history.

(56) References Cited

U.S. PATENT DOCUMENTS

2016/0307971 A1* 10/2016 Jeon ..................... H01L 27/3258
2016/0351093 A1* 12/2016 Kim ...................... G09G 3/2092
2018/0158741 A1* 6/2018 Kim ......................... H01L 22/12

FOREIGN PATENT DOCUMENTS

| JP | 2007264354 | 10/2007 |
|---|---|---|
| JP | 2014122974 | 7/2014 |
| KR | 1020140118955 | 10/2014 |
| KR | 1020160017845 | 2/2016 |
| KR | 1020160080289 | 7/2016 |
| KR | 1020160124301 | 10/2016 |
| KR | 1020160139122 | 12/2016 |

* cited by examiner

*Primary Examiner* — Tong-Ho Kim
(74) *Attorney, Agent, or Firm* — F. Chau & Associates, LLC

(57) ABSTRACT

A display device includes a substrate, a display area disposed on the substrate and including a plurality of pixels and data lines, a peripheral area disposed outside the display area of the substrate, a pad portion disposed in the peripheral area, an encapsulation layer disposed in the peripheral area and the display area, and disposed on the plurality of pixels of the display area, a crack detection circuit disposed in the peripheral area, and a first crack detection line connected with the pad portion and the crack detection circuit. The first crack detection line is disposed on the encapsulation layer.

25 Claims, 20 Drawing Sheets

DISPLAY DEVICE

CROSS-REFERENCE TO RELATED APPLICATION

This application claims priority under 35 USC § 119 to Korean Patent Application No. 10-2016-0165137, filed on Dec. 6, 2016 in the Korean Intellectual Property Office (KIPO), the disclosure of which is incorporated by reference herein in its entirety.

TECHNICAL BACKGROUND

Exemplary embodiments of the present inventive concept relates to a display device.

DISCUSSION OF RELATED ART

A display device such as a liquid crystal display (LCD), a light emitting diode display, and the like may include a display panel that includes a plurality of pixels that can display an image and a plurality of signal lines. Each pixel may include a pixel electrode that may receive a data signal, and the pixel electrode may be connected with at least one transistor to receive the data signal. The display panel may include a plurality of stacked layers.

In a manufacturing process of the display panel, a crack may occur in a substrate or a layer that is stacked on the substrate due to an impact applied to the display panel. The crack may gradually increase in size, or may propagate to another layer or another area, thereby causing a defect in the display panel. For example, if a crack occurs in a signal line such as a data line or a scan line, a short-circuit may occur or resistance may be increased, and moisture and the like may be permeated into the display panel, thereby deteriorating reliability of a light emission element. As a result, the display panel may not operate properly. For example, one of more pixels of the display panel may not be turned on to emit light. In another example, one or more pixels may be erroneously turned on.

For example, the flexible display may be twisted or bent multiple times during its use. Once a crack is initiated in the substrate or a layer on the substrate of the display panel, the crack may further propagate with increased number of twisting and bending, and may eventually result in the breakage of the display panel.

SUMMARY

According to an exemplary embodiment of the present inventive concept, a display device includes a substrate, a display area with a plurality of pixels and data lines. The display area is disposed on the substrate. The display device further includes a peripheral area disposed outside the display area of the substrate. The display device further includes a pad portion disposed in the peripheral area, and an encapsulation layer disposed on at least one of the peripheral area and the display area. The encapsulation layer is disposed on the plurality of pixels of the display area of the substrate. The display device still further includes a crack detection circuit disposed in the peripheral area, and a first crack detection line disposed in the peripheral area. The first crack detection line is connected with the pad portion and the crack detection circuit. The first crack detection line is disposed on the encapsulation layer.

According to an exemplary embodiment of the present inventive concept, a display device includes a substrate, a display area with a plurality of pixels and data lines. The display area is disposed on the substrate. The display device further includes a peripheral area disposed outside the display area of the substrate. The display device further includes an encapsulation layer disposed on at least one of the peripheral area and the display area. The display device still further includes a crack detection circuit having switches that is disposed in the peripheral area, and a first crack detection line connected with the crack detection circuit. The first crack detection line is disposed on the encapsulation layer and disposed in the peripheral area. The display device further includes a capping layer that extends along an edge of the encapsulation layer. The capping layer coves the edge of the encapsulation layer.

According to an exemplary embodiment of the present inventive concept, a display device includes a substrate, a display area with a plurality of pixels and data lines. The display area is disposed on the substrate. The display device further includes a peripheral area disposed outside the display area of the substrate. The display device further includes an encapsulation layer disposed in the peripheral area and the display area. The encapsulation layer is disposed on the plurality of pixels of the display area of the substrate. The display device still further includes a first crack detection line disposed on the encapsulation layer, and a second crack detection line disposed under the encapsulation portion. The first crack detection line and the second crack detection line are connected with each other.

BRIEF DESCRIPTION OF THE DRAWINGS

The above and other features of the inventive concept will become more apparent by describing in detail exemplary embodiments thereof, with reference to the accompanying drawing, which.

DETAILED DESCRIPTION OF THE EMBODIMENTS

Various exemplary embodiments of the present inventive concept will be described more fully hereafter with reference to the accompanying drawings, in which some exemplary embodiments are shown. The present inventive concept may, however, be embodied in many different forms and should not be construed as limited to the exemplary embodiments set forth herein.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning, on or below the object portion, but does not essentially mean positioning on the upper side of the object portion based on a gravitational direction.

A display device according to one or more exemplary embodiments of the present inventive concept will be described with reference to FIG. 1 to FIG. 3.

Figure 1:
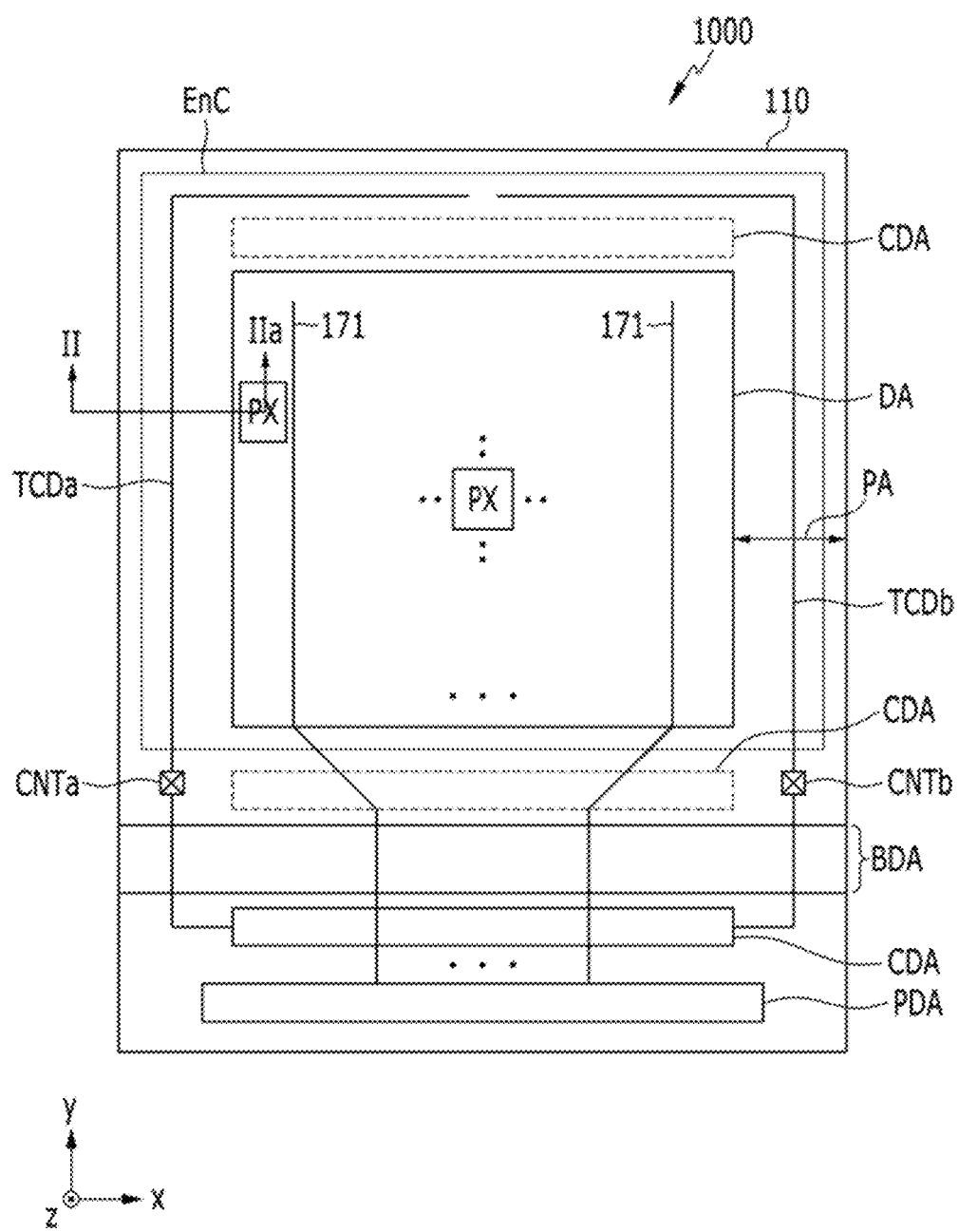
FIG. 1 is a schematic top plan view of a display panel included in a display device according to an exemplary embodiment of the present inventive concept.
Figure 2:
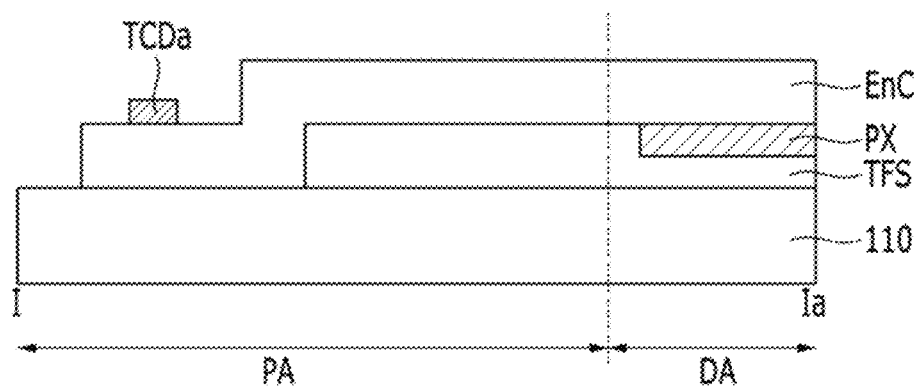
FIG. 2 is a cross-sectional view of the display device of FIG. 1, taken along the line II-IIa according to an exemplary embodiment of the present inventive concept.
Figure 3:
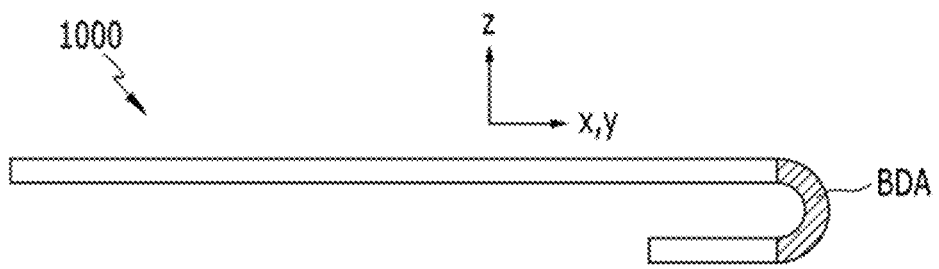
FIG. 3 shows the display panel in a bent state according to the exemplary embodiment according to an exemplary embodiment of the present inventive concept.

Referring to FIG. 1 and FIG. 2, a display device 1000 according to an exemplary embodiment includes a display area DA and a peripheral area PA. The peripheral area PA may be disposed outside the display area DA. The peripheral area PA may include a left side peripheral area PA, a right side peripheral area PA, a top side peripheral area PA, and a bottom side peripheral area PA. The peripheral area PA may further include, for example, a top-left side peripheral area PA and a top-right side peripheral area PA.

The display area DA may include a plurality of pixels PX, and a plurality of signal lines that are arranged on a plane extending in an x-axis and a y-axis direction. The display area DA may display an image on the plane that is parallel with the x-axis direction and the y-axis direction. Hereinafter, a structure viewed in a direction that is perpendicular to the x-axis direction and the y-axis direction will be referred to as a planar structure, and a structure viewed when cut in a direction that is perpendicular to the x-axis direction and the y-axis direction will be referred to as a cross-sectional structure.

The signal lines may include a plurality of gate lines (not shown) that transmit a gate signal and a plurality of data lines 171 that transmit a data signal. Each data line 171 may substantially extend in the y-axis direction in the display area DA, and may be connected with a pad portion PDA that is disposed in the peripheral area PA by extending each data line 171 to the peripheral area PA.

Each pixel PX may include at least one switch (not shown) and a pixel electrode (not shown) connected to the switch. The switch may be a three terminal element such as a transistor integrated with the display panel 1000. The switch may selectively transmit a data signal to the pixel electrode by being turned on or turned off according to a gate signal transmitted by the gate line.

In order to realize color display, each pixel PX may display one of given colors, and an image of a desired color can be recognized by a sum of the given colors. As an example of specific colors that are represented by the plurality of pixels PX, three primary colors of red, green, and blue or three primary colors of yellow, cyan, and magenta and the like may be included, and at least one other color such as white may further be included in addition to the three primary colors.

The display panel 1000 may further include a substrate 110 where the pixel PX and the signal line may be formed. The substrate 110 may include glass, plastic, and the like, and may have flexibility. For example, the substrate 110 may include various types of plastic such as polyethylene terephthalate (PET), polyethylene naphthalate (PEN), polycarbonate (PC), polyarylate (PAR), polyetherimide (PEI), polyethersulfone (PES), polyimide (PI), and the like, a metal thin film, or ultra-thin glass.

Referring to FIG. 2, a plurality of layers TFS may be disposed on the substrate 110, and the plurality of layers TFS may include the plurality of pixels PX. Although it is not schematically illustrated in FIG. 2, the plurality of layers TFS may include a plurality of insulation layers and a plurality of conductive layers that form the pixels PX and signal lines. A detailed cross-sectional structure of the plurality of layers TFS will be exemplarily described later.

An encapsulation layer (may be referred to as an encapsulation portion) EnC that encapsulates the plurality of layers TFS including the pixels PX to prevent moisture and/or oxygen from permeating into the display panel from the outside may be disposed on the plurality of layers TFS. The encapsulation layer EnC may be disposed on at least one of the peripheral area PA and the display area DA. The encapsulation layer EnC may include at least one inorganic layer and at least one organic layer, and the organic layer and the inorganic layer may be alternately stacked. The topmost surface of the encapsulation layer EnC may be substantially flat. The encapsulation layer EnC is not limited to the present exemplary embodiment, and may have various structures such as an organic polymer layer such as a polyester formed laminated on the plurality of layers TFS, a sealed encapsulation substrate, and the like.

Referring back to FIG. 1, an edge of the encapsulation layer EnC may be disposed inside an edge of the substrate 110. Alternately, the edge of the encapsulation layer EnC may substantially match the edge of the substrate 110.

Referring still back to FIG. 1, the peripheral area PA may include a pad portion PDA, a bending area BDA, first crack detection lines TCDa and TCDb, and a crack detection circuit CDA.

The pad portion PDA may be disposed at one edge of the display panel 1000, and may include a plurality of pads that can be electrically connected with a driving chip (not shown) or a pad of a circuit film (not shown). Although it is not illustrated, the display device according to one or more exemplary embodiments of the present inventive concept may further include a driving chip or a circuit film that may be electrically connected with the display panel 1000 through the pad portion PDA. The circuit film may be provided as a film, and may include a driving chip attached thereon. The driving chip disposed on the display panel 1000 or disposed on the circuit film may include a data driver, a timing controller, and the like for generating a data signal for driving of the pixels PX, and may transmit various driving voltages to the display panel 1000.

The bending area BDA may extend in the x-axis direction substantially across the display panel 1000. FIG. 1 shows the display panel 1000 including the bending area BDA in an unfolded state, and FIG. 3 shows that the bending area BDA of the display panel 1000 in the bent state. When the display panel 1000 is bent in the bending area BDA in a predetermined direction, a portion of the peripheral area PA that is disposed outside the bending area BDA may bend as well. For example, as shown in FIG. 3, when an edge portion of the display panel 1000 is bent in a downward direction, a portion of the peripheral area PA outside the bending area BDA may also bend, and may not be visible when viewed from a front side in the z-axis direction. A plurality of wires may be disposed in the bending area BDA, and the plurality of wires in the bending area BDA may substantially be stretched in the y-axis direction in the bending area BDA. At least a portion of the plurality of layers TFS disposed on the substrate 110 may not be formed in the bending area BDA.

According to another exemplary embodiment of the present inventive concept, the bending area BDA may be omitted.

The first crack detection lines TCDa and TCDb may be disposed in the peripheral area PA, and may extend along the edge of the display area DA while surrounding the left, the right, and the top portions of the display area DA. For example, the first crack detection line TCDa may include a portion that may extend substantially in the y-axis direction in the left side peripheral area PA, and a portion that may extend substantially in the x-axis direction in the top-left side peripheral area PA. The first crack detection line TCDb may include a portion that may extend substantially in the y-axis direction in the right side peripheral area PA and a portion that may extend substantially in the x-axis direction from the top-right side peripheral area PA.

As shown in FIG. 1, the first crack detection lines TCDa, TCDb may be respectively illustrated as lines. In other embodiments, they may include portions that are formed by one or more round trips in the peripheral area PA. For example, each of the first crack detection lines TCDa and TCDb may extend along the substantially entire peripheral area PA outside the display area DA, form at least one bent portion extending in the back and forth direction in the left and right peripheral area PA and/or the upper peripheral area PA, and connect with the crack detection circuit CDA after passing through the bending area BDA. The crack detection circuit CDA may include a plurality of switches (not shown).

Differing from illustrated in FIG. 1, the first crack detection lines TCDa and TCDb may be connected with each other. For example, the first crack detection lines TCDa and TCDb may be connected with each other in the upper peripheral area PA.

While not shown in FIG. 1, in another embodiment, the first crack detection lines TCDa and TCDb may be connected with the pad portion PDA and receive a test voltage.

The first crack detection lines TCDa and TCDb may include at least one contact portion CNTa and CNTb, respectively, disposed outside the periphery of the bending area BDA. In one example, each of the first crack detection lines TCDa and TCDb may include multiple portions that may be connected with through the contact portions CNTa and CNTb. The multiple portions of the first crack detection lines TCDa and TCDb may be disposed in different layers. The contact portions CNTa and CNTb may include at least one contact hole.

Referring to FIG. 1 and FIG. 2, the first crack detection lines TCDa and TCDb may extend along the peripheral area PA, and the first crack detection lines TCDa and TCDb may overlap the encapsulation layer EnC in a plan view, for example, as shown in FIG. 1, and may be disposed on the encapsulation layer EnC in a cross-sectional view, for example, as shown in FIG. 2. A defect may occur in the encapsulation layer EnC. For example, a crack may occur in the encapsulation layer EnC. Alternately, a layer of the encapsulation layer EnC may be delaminated or lifted from the substrate 110. A portion of the first crack detection lines TCDa and TCDb may be damaged by the defects in the encapsulation layer EnC. For example, a portion of the first crack detection lines TCDa and TCDb on the cracked encapsulation layer EnC may be damaged, which may result in an increase of wire resistance of the first crack detection lines TCDa and TCDb. The existence of a defect in the encapsulation layer EnC may be substantially accurately detected by detecting an abrupt change in the wire resistance of the first crack detection lines TCDa and TCDb. When the encapsulation layer EnC is lifted, or a crack occurs in the encapsulation layer EnC, an impurity may permeate into the display panel 1000 and the crack may spread to other layers, thereby causing damage to several elements. Accordingly, sensitive and accurate detection of a defect in the encapsulation layer EnC may be possible.

The contact portions CNTa and CNTb may be disposed outside the periphery of the encapsulation layer EnC. For example, as shown in FIG. 1, the contact portions CNTa and CNTb may be disposed on portions that do not overlap the encapsulation layer EnC when viewed from the z-direction. For example, the contact portions CNTa and CNTb may be disposed outside the lower periphery of the encapsulation layer EnC in FIG. 1.

As shown in FIG. 1, the crack detection circuit CDA may be disposed between the pad portion PDA and the display area DA, but this is not restrictive. For example, the crack detection circuit CDA may be disposed in the peripheral area PA as marked by a dotted rectangle. In another example, for the display panel 1000 with the bending area BDA, the crack detection circuit CDA may be disposed between the display area DA and the bending are BDA as marked by a dotted rectangle below the display area DA, for example, as shown in FIG. 1.

The first crack detection lines TCDa and TCDb and the crack detection circuit CDA may detect a defect such as a crack, lifting, and the like that may occur in the encapsulation layer EnC or layers at the periphery of the encapsulation layer EnC through wire resistance variation in the peripheral area PA of the display panel 1000. The wire resistance variation of the first crack detection lines TCDa and TCDb may be determined by testing a turn-on state of the display area DA through the crack detection circuit CDA.

Now, a detailed structure of a display device according to an exemplary embodiment of the present inventive concept will he described with reference to FIG. 4 to FIG. 10, together with the above-described FIG. 1 to FIG. 3. Hereinafter, the same elements in the exemplary embodiment described above may be given the same reference numerals, and the corresponding description may be omitted.

Figure 4:
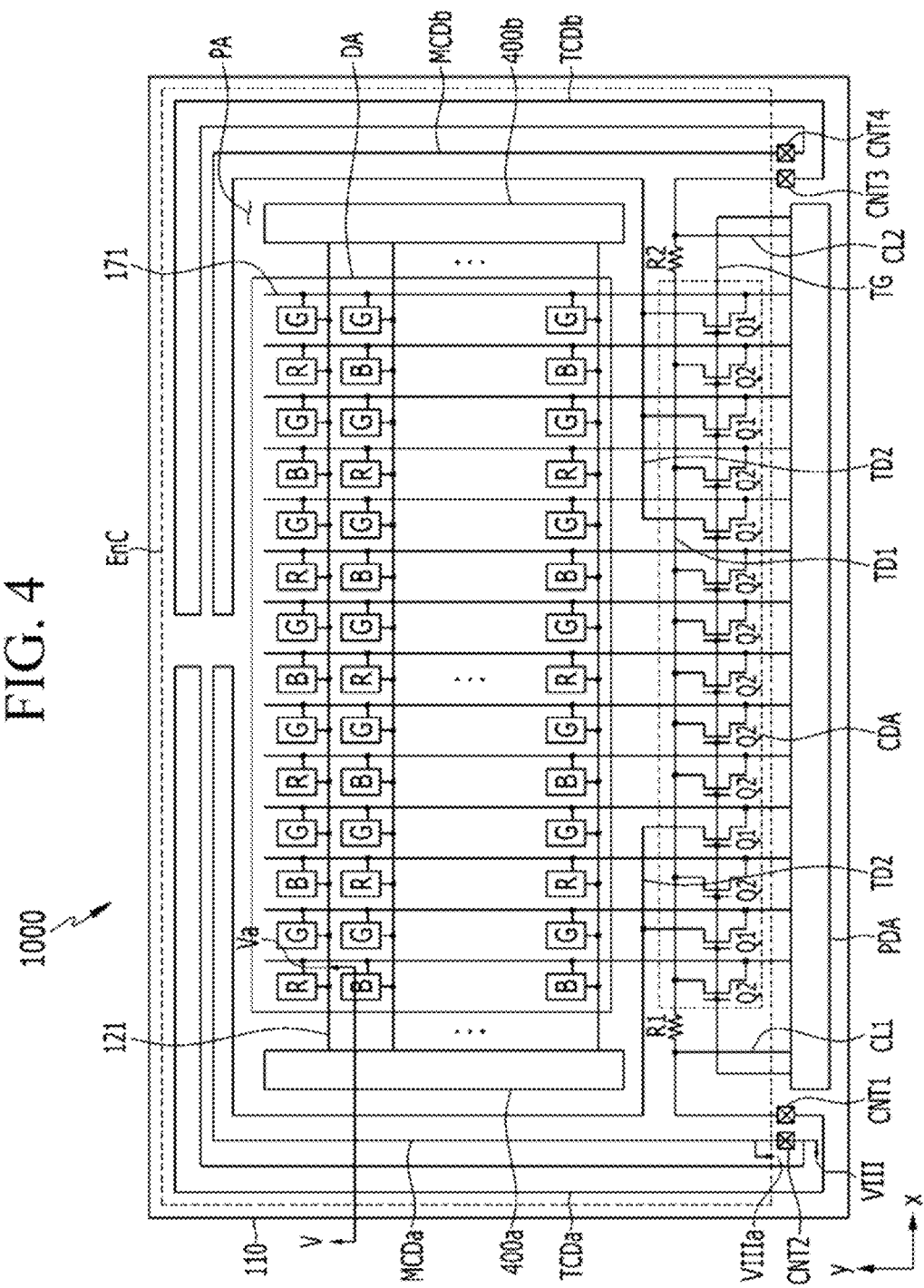
FIG. 4 is a top plan view of the display panel included in the display device according to an exemplary embodiment of the present inventive concept.

Referring to FIG. 4, a planar structure of the display device will be described, and a cross-sectional structure of a display device will be described with reference to FIG. 5 and FIG. 6.

Referring to FIG. 4, a plurality of pixels PX that are disposed in the display area DA may display specific colors, for example, red, green, and blue. In one example, four pixels that are adjacent to each other in a quadrangular shape may include two green pixels G, one red pixel R, and one blue pixel B. In another example, a pixel column that includes only the green pixel G and a pixel column that includes the red pixel R and the blue pixel B may be alternately arranged in the y-axis direction in each pixel column. However, the arrangement of the plurality of pixels PX is not limited to the above-stated arrangement, and may have various arrangements.

The plurality of signal lines that are disposed in the display area DA may further include a plurality of gate lines 121 that transmit a gate signal. Each of the plurality of gate lines 121 may extend substantially in the x-axis direction and thus may cross the data lines 171. Each of the pixels R, G, and B may be connected with one data line 171 and at least one gate line 121.

The display panel 1000 may further include gate drivers 400a and 400b that may be disposed in the peripheral area PA, and the gate drivers 400a and 400b may be connected with the plurality of gate lines 121 to apply a gate signal. The gate drivers 400a and 400b may be disposed on the substrate 110 together with the plurality of signal lines and a switching element that may be disposed in the display area DA. Thus, the gate drivers 400a and 400b may include the same layer as the layer included in the above-described plurality of layers TFS. In FIG. 4, the gate drivers 400a and 400b may be disposed in the left side and the right side with respect to the display area DA, but this is not restrictive. For example, one of the gate drivers 400a and 400b disposed in one side with respect to the display area DA may be omitted, and only one gate driver may be disposed.

Referring to FIG. 4, the first crack detection lines TCDa and TCDb may respectively include bent portions formed by extending in the back and forth direction in the peripheral area PA outside the display area DA, specifically, in the left and right side peripheral area PA and/or in an upper side peripheral area PA. For example, the first crack detection lines TCDa and TCDb may have the bent portions at the lower portions of the left and right side peripheral areas PA. The first crack detection lines TCDa and TCDb may further extend in the y-axis direction, respectively, bent by a predetermined angle to extend in the x-axis direction in the upper side peripheral area PA to an approximately center portion of the upper side peripheral area PA. Subsequently, the extension direction of the first crack detection lines TCDa and TCDb may be changed so that the first crack detection lines TCDa and TCDb extends in the upper-left side peripheral area PA and the left side peripheral area PA in a predetermined way. In another example, each bent portion may have a meandering shape by extending in the back and forth direction.

Opposite ends of each of first crack detection lines TCDa and TCDb may be disposed without overlapping the encapsulation layer EnC. For example, one end of the each of the first crack detection lines TCDa and TCDb may be connected with the crack detection circuit CDA through the contact portions CNT1 and CNT3. The other end of each of the first crack detection lines TCDa and TCDb may be connected with contact portions CNT2 and CNT4. The contact portions CNT1 and CNT2 may be opposite ends of the first crack detection line TCDa, and the contact portions CNT3 and CNT4 may be opposite ends of the second crack detection line TCDb. As shown in FIG. 4, all the contact portions CNT1, CNT2, CNT3, and CNT4 may not overlap the encapsulation layer EnC in the plan view.

Second track detection lines MCDa and MCDb may be further disposed in the peripheral area PA. The second crack detection lines MCDa and MCDb may also he arranged around the display area DA. The alignment of the second crack detection lines MCDa and MCDb may be substantially the same as that of the first crack detection lines TCDa and TCDb, but this is not restrictive.

Still referring to FIG. 4, the second crack detection lines MCDa and MCDb may be respectively connected with one end of each of the first crack detection lines TCDa and TCDb through the contact portions CNT2 and CNT4. The second crack detection line MCDa is electrically connected with the first crack detection line TCDa through the contact portion CNT2, and the second crack detection line MCDb is electrically connected with the first crack detection line TCDb through the contact portion CNT4. Thus, the first crack detection line TCDa and the second crack detection line MCDa may form bent portions by bending multiple times in the left side peripheral area PA and the upper side peripheral area PA. In addition, the first crack detection line TCDb and the second crack detection line MCDb may form bent portions by bending multiple times in the right side peripheral area PA and the upper side peripheral area PA.

Either the first crack detection line TCDa and the second crack detection line MCDa that are connected with each other, or the first crack detection line TCDb and the second crack detection line MCDb that are connected with each other may form one connected line, and may be called a crack detection route. In another embodiment, one of the first crack detection lines TCDa or TCDb may form the crack detection route. Still in another embodiment, one of the second crack detection lines MCDa and MCDb may form the crack detection route. For example, the crack detection route may be disposed in the left side peripheral area PA. The crack detection route may start from the contact portion CNT1 or the pad portion PDA that receives a test voltage. For example, the first crack detection line TCDb may be bent a plurality of times in the peripheral area PA around the display area DA, and then may arrive at the contact portion CN2 or the crack detection circuit CDA to be connected with the second crack detection line MCDb to form the crack detection route.

As shown in FIG. 4, one end of each of the second crack detection lines MCDa and MCDb may be connected with a test signal line TD2 disposed on the left and right portion of the substrate 110, respectively. For example, one end of the test signal line TD2 connected with the second crack detection line MCDa may be disposed opposite one end of the test signal line TD2 connected with the second crack detection line MCDb, while the test signal lines TD2 may not be electrically connected with each other because they are disposed apart from each other. The test signal line TD2 may substantially extend in the x-axis direction in a region between the pad portion PDA and the display area DA, and may cross the data line 171 in an insulated manner.

At least a portion of the second crack detection lines MCDa and MCDb may be disposed between the display area DA and the first crack detection lines TCDa and TCDb in the peripheral area PA, but the second crack detection lines MCDa and MCDb may be positioned elsewhere. For example, locations of the first crack detection lines TCDa and TCDb and locations of the second crack detection lines MCDa and MCDb may be switched with each other.

The crack detection circuit CDA may include a test signal line TD1. The test signal line TD1 may substantially extend in the x-axis direction in a region between the pad portion PDA and the display area DA, and may cross the data line 171 in an insulated manner.

The test signal line TD1 may be connected with the pad portion PDA through connection wires CL1 and CL2 to receive the test voltage. The first crack detection lines TCDa and TCDb and the test signal line TD1 may receive substantially the same test voltage from the pad portion PDA through the connection wires CL1 and CL2.

The crack detection circuit CDA may further includes a plurality of switches Q1 and Q2 and a test gate line TG. In one example, the switch Q1 may be different from the switch Q2. The plurality of switches Q1 and Q2 may be arranged in one row substantially in the x-axis direction, and each of the switches Q1 and Q2 may correspond to each of the plurality of data lines 171. The test gate line TG may extend substantially in the x-axis direction.

As also shown in FIG. 4, gate terminals of the switches Q1 and Q2 may be connected with the test gate line TG, and output terminals of the switches Q1 and Q2 may be connected with corresponding data lines 171. An input terminal of the switch Q1 may be connected with the test signal line TD2, and an input terminal of the switch Q2 may be connected with the test signal line TD1. The switch Q1 may be disposed in a part of the crack detection circuit CDA, for example, a part of the left edge of the crack detection circuit CDA, but this is not restrictive. In another embodiment, as shown in FIG. 4, the switch Q1 and the switch Q2 may be alternately arranged in the x-axis direction in at least a part of the crack detection circuit CDA, but this is not restrictive.

Pixels R, G, and B may be connected with the data line 171 which is connected to the switch Q1 to include a specific color. For example, as shown in FIG. 4, a first pixel array connected with the data line 171 to which the switch Q1 is connected may include green pixels, but this is not restrictive. A color represented by a pixel that is connected with the switch Q2 that is adjacent to the switch Q2 may be different from a color represented by the pixel connected with the switch Q1. For example, the data line 171 connected with the switches Q2 that are adjacent to the switches Q1 may be connected to a second pixel array that includes red pixels R and blue pixels B as shown in FIG. 4. In a region where the switches Q2 are disposed, for example, in a region where the plurality of switches Q2 are disposed continuously adjacent to each other, colors represented by pixels that are connected with a data line 171 to which the switches Q2 are connected may not be limited to a specific color. For example, colors represented by pixels that are connected with the adjacent plurality of switches Q2 may include red, blue, and green.

Still referring to FIG. 4, matching resistors R1 and R2 may be connected between the pad portion PDA and the test signal line TD1. The test voltage applied through the pad portion PDA may be reduced by a first voltage difference through the matching resistors R1 and R2 before the reduced test voltage is transmitted through the test signal line TD1 and then applied to the input terminal of the switch Q2. Meanwhile, the test voltage applied through the pad portion PDA may be transmitted to the crack detection route. For example, the test voltage may be transmitted through the crack detection route including the first crack detection line TCDa and the second crack detection line MCDa connected to each other, and, and/or the first crack detection line TCDb and the second crack detection line MCDb connected to each other.

A voltage reduced by a second voltage difference from wire resistance of the crack detection route may be applied to the input terminal of the switch Q1 of the crack detection circuit CDA through the test signal line TD2. Resistance of the matching resistors R1 and R2 may be equivalent to or similar to the wire resistance. For example, the first voltage difference and the second voltage difference may be set to be substantially the same or corresponding to each other by the resistance values of the matching resistors R1 and R2 in a normal state, which is a state in which no damage such as a crack or lifting may occur in the crack detection route.

However, it is noted that the resistance values of the matching resistors R1 and R2 are not limited thereto, and may be set to appropriate values as necessary. For example, the resistance values of the matching resistors R1 and R2 may be set to be equivalent to crack detection sensitivity and the like.

According to another exemplary embodiment of the present inventive concept, locations of the first crack detection lines TCDa and TCDb and locations of the second crack detection lines MCDa and MCDb may be switched with each other. For example, the second crack detection lines MCDa and MCDb may receive the test voltage by being connected with the connection wires CL1 and CL2, and the first crack detection lines TCDa and TCDb may be connected with the test signal line TD2.

Next, a cross-sectional structure of the display device according to the exemplary embodiment will be described with reference to FIG. 5 and FIG. 6, together with FIG. 4. Referring to FIG. 5 and FIG. 6, a barrier layer 120 may be disposed on the substrate 110. The barrier layer 120 may include a plurality of layers as shown in FIG. 5A, or may be provided as a single layer.

An active pattern nay be disposed on the barrier layer 120. The active pattern may include a first active pattern 130 that may be disposed in the display area DA, and a second active pattern 130d that is disposed in the peripheral area PA. Each of the first and second active patterns 130 and 130d may include a source region and a drain region, and a channel region that is disposed between the source region and the drain region. One of the first and second active patterns may include amorphous silicon, polysilicon, an oxide semiconductor, and the like.

A first insulation layer 141 may be disposed on the first and second active patterns 130 and 130d, and a first conductive layer may be disposed on the first insulation layer 141. The first conductive layer may include a first conductor 155 that may overlap the first active pattern 130 disposed in the display area DA, a conductor 150d that may overlap the second active pattern 130d disposed in the peripheral area PA, the above-described plurality of gate lines 121, and the test gate lines RG1 and TG2.

A transistor TRa may include the first active pattern 130 and the first conductor 155 that may overlap the first active pattern 130. A transistor TRd may include the second active pattern 130d and the conductor 150d that may overlap the second active pattern 130d. The transistor TRa may serve as switches included in the pixels PX, such as R, G, and B that are disposed in the display area DR. The transistor TRd may serve as, for example, a switch (not shown) included in gate drivers 400a and 400b or serve as the switches Q1 and Q2 included in the crack detection circuit CDA. A detailed structure of the pixel PX will be described later.

A second insulation layer 142 may be disposed on the first conductive layer (for example first conductor 155) and the first insulation layer 141, and a second conductive layer may be disposed on the second insulation layer 142. The second conductive layer may be the above-described second crack detection lines MCDa and MCDb. In other embodiments, the second crack detection lines MCDa and MCDb may be disposed at the same layer as the first conductive layer and may include the same material as the first conductive layer.

The second conductive layer may further include the above-described test signal lines TD1 and TD2. In other embodiments, at least one of the test signal lines TD1 and TD2 may be disposed in the first conductive layer.

A third insulation layer 160 may be disposed on the second conductive layer and the second insulation layer 142.

At least one of the first insulation layer 141, the second insulation layer 142, and the third insulation layer 160 may include an inorganic insulation material such as a silicon nitride (SiNx), a silicon oxide (SiOx), and the like, and/or an organic insulation material. At least one of the first insulation layer 141, the second insulation layer 142, and the third insulation layer 160 may be at least partially removed in the bending area BDA.

The first insulation layer 141, the second insulation layer 142, and the third insulation layer 160 may include a contact hole 165 that may be disposed on the source regions and/or the drain regions of the transistors TRa and TRd.

A third conductive layer may be disposed on the third insulation layer 160. The third conductive layer may include a conductor 170 that may be connected with the source regions or the drain regions of the transistors TRa and TRd through the contact hole 165. The third conductive layer may also include a voltage transmission line 177 and the above-described data line 171. The voltage transmission line 177 may be disposed in the peripheral area PA, and may transmit a constant voltage such as a common voltage LEVSS.

At least one of the first conductive layer, the second conductive layer, and the third conductive layer may include a metal such as copper (Cu), aluminum (Al), molybdenum (Mo), titanium (Ti), an alloy thereof, and the like, and may be provided as a multilayer (for example, Ti/Al/Ti) formed of such a plurality of metal materials, or as a single layer.

A passivation layer 180 may be disposed on the third conductive layer and the third insulation layer 160. The passivation layer 180 may include an inorganic insulating material and/or an organic insulation material such as polyacrylic resin, a polyimide resin, and the like, and an upper surface of the passivation layer 180 may be substantially flat. The passivation layer 180 may include a contact hole (not shown) that may be disposed on the voltage transmission line 177 that is disposed in the peripheral area PA.

A pixel electrode layer may be disposed on the passivation layer 180. The pixel electrode layer may include a pixel electrode 191 that corresponds to each pixel PX and a voltage transmission electrode 197 that may be disposed in the peripheral area PA. The voltage transmission electrode 197 may be electrically and physically connected with the voltage transmission line 177 through the contact hole of the passivation layer 180 and thus may receive the common voltage ELVDD. The pixel electrode layer may include a semi-permeable conducting material or a reflective conducting material.

A pixel defining layer 350 may be disposed on the passivation layer 180 and the pixel electrode layer. The pixel defining layer 350 may include an opening 351 that is disposed on the pixel electrode 191, and may further include at least one dam portion 350d that is disposed in the peripheral area PA. The at least one dam portion 350d may extend in a direction perpendicular to the surface of the substrate 110. A spacer 360d may further be disposed on the dam portion 350d.

The voltage transmission electrode 197 may include a portion that is not covered by the pixel defining layer 350. The pixel defining layer 350 may include a photosensitive material such as a polyacrylate resin, a polyimide resin, and the like.

An emission layer 370 is disposed on the pixel electrode 191. The emission layer 370 may include portion that is disposed inside the opening 351 of the pixel defining layer 350. The emission layer 370 may further include at least one dummy emission layer 370d that is disposed in the peripheral area PA and on the pixel defining layer 350. The emission layer 370 may include an organic emission material or an inorganic emission material.

A common electrode 270 may be disposed on the emission layer 370. The common electrode 270 may also be disposed on the pixel defining layer 350, and thus may be continuously formed throughout the plurality of pixels PXs. The common electrode 270 may be physically and electrically connected with the voltage transmission electrode 197 in the peripheral area PA, and may receive the common voltage ELVSS. The common electrode 270 may include a conductive transparent material.

The pixel electrode 191, the emission layer 370, and the common electrode 270 of each pixel PX form an emission diode ED, and one of the pixel electrode 191 and the common electrode 270 may be a cathode and the other may be an anode.

An encapsulation layer 380 may protect the emission diode ED by encapsulating the emission diode ED, and may be disposed on the common electrode 270. The encapsulation layer 380 may be the same as the above-described encapsulation layer EnC. The encapsulation layer 380 may include at least one inorganic layer 381 and 383 and at least one organic layer 382, and the at least one inorganic layer 381 and 383 and the at least one organic layer 383 may be alternately stacked. The organic layer 382 may include an organic material and may have a planarization characteristic. The inorganic layers 381 and 383 may include an inorganic material such as an aluminum oxide (AlOx), a silicon oxide (SiOx), a silicon nitride (SiNx), and the like.

A planar area of the inorganic layers 381 and 383 may be wider than a planar area of the organic layer 382, thus two different inorganic layers 381 and 383 may contact each other in the peripheral area PA. One of the two inorganic layers 381 and 383 may contact an upper surface of the third insulation layer 160 in the peripheral area PA. On the other hand, in other embodiments, one of the two inorganic layers 381 and 383 may not contact the upper surface of the third insulation layer 160. In the peripheral area PA, the inorganic layers 381 and 383 of the encapsulation layer 380 may overlap the first crack detection lines TCDa and TCDb and the second crack detection lines MCDa and MCDb in the plan view.

An edge of the organic layer 382 may be disposed between the dam portion 350d and the display area DA. The dam portion 350d may serve to prevent the organic material from flowing outside when the organic layer 382 of the encapsulation layer 380 is formed, and accordingly, the edge of the organic layer 382 of the encapsulation layer 380 may be disposed to be closer to the display area DA than the dam portion 350d.

A buffer layer 389 may include an inorganic insulation material and/or an organic insulation material, and may be disposed on the encapsulation layer 380. In other embodiments, the buffer layer 389 may be omitted.

A touch sensor may be disposed on the buffer layer 389.

The touch sensor may include at least one conductive layer and at least one insulation layer that may be disposed on the buffer layer 389. In some embodiments, the touch sensor may include a fourth conductive layer. The fourth conductive layer may include first touch conductors TEa. The touch sensor may further include a first touch insulation layer 391 that may be disposed on the fourth conductive layer and a fifth conductive layer that may be disposed on the first touch insulation layer 391. The fifth conductive layer may include second touch conductors TEb. The touch sensor may further include a second touch insulation layer 392 that may be disposed on the fifth conductive layer. At least one of the first touch insulation layer and the second touch insulation layer may include an inorganic insulation material or/and an organic insulation material.

Figure 7:
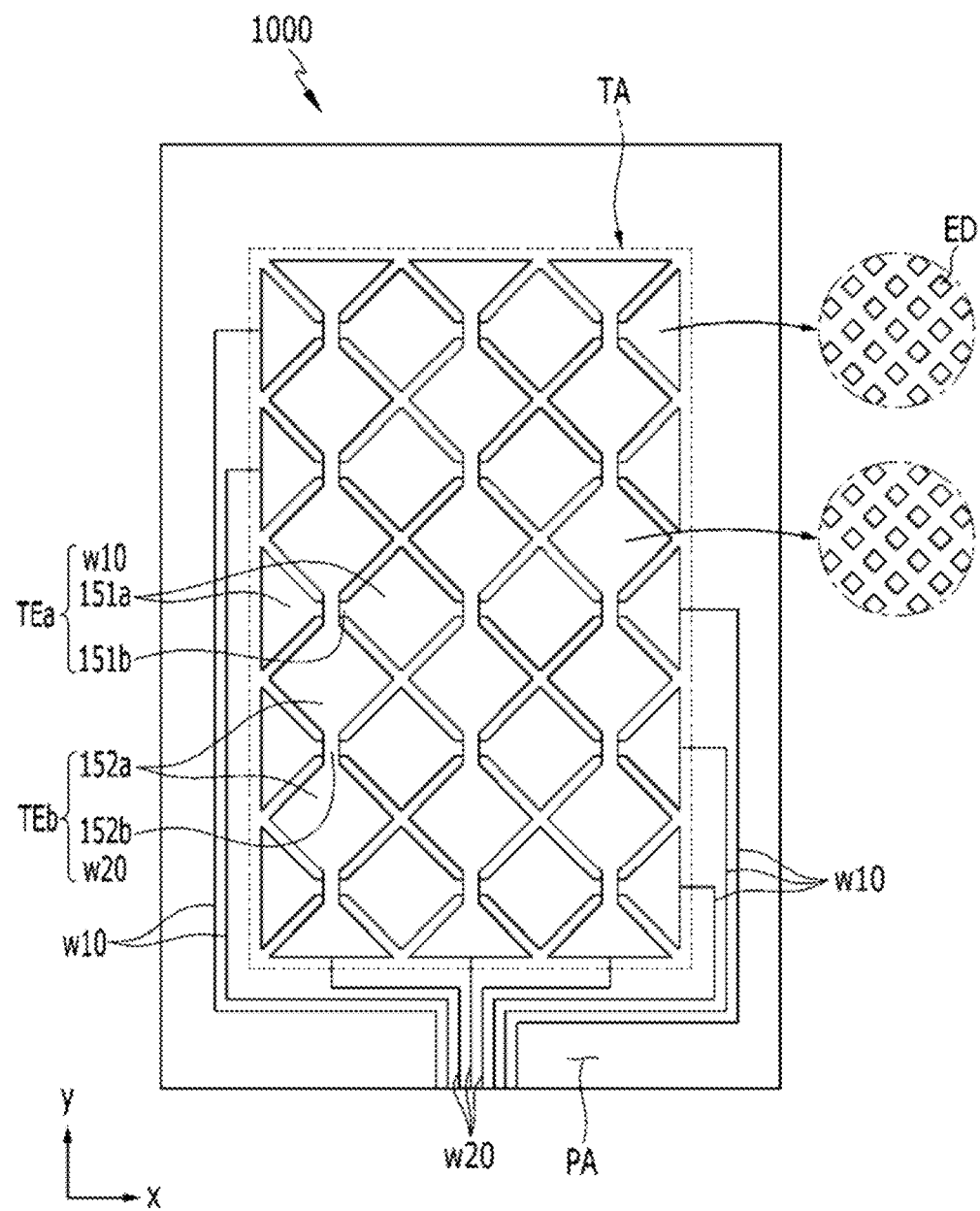
FIG. 7 is a top plan view of a touch sensor included in the display device according to an exemplary embodiment of the present inventive concept.

Referring to FIG. 7, each first touch conductor TEa may include a plurality of first touch electrodes 151a that may be substantially arranged in a matrix format, first connection portions 151b that connect first touch electrodes 151a that are arranged in the x-axis direction with each other, and first touch wires w10 that may be connected with the plurality of first touch electrodes 151a and transmit signals. Each second touch conductor TEb may include a plurality of second touch electrodes 152a that may be substantially arranged in a matrix format, second connection portions 152b that connect second touch electrodes 152a that are arranged in the y-axis direction with each other, and second touch wires w20 that may be connected with the plurality of second touch electrodes 152a and transmit signals.

The first touch electrodes 151a and the second touch electrodes 152a may be disposed in a touch sense area TA. The touch sense area TA is an area where a touch made by an external object can be sensed, and may be substantially the same as the above-described display area DA. On the other hand, in other embodiments, the touch sense area TA may not coincide with the display area DA.

A first touch electrode 151a and a second touch electrode 152a that are adjacent to each other may form a mutual sense capacitor to sense a capacitance change that is caused by a touch of the external object to thereby sense touch information such as whether or a touch is made, a touch location, and the like. A capacitance change signal according to the touch may be transmitted to a touch controller (not shown) through the first touch wire w10 and the second touch wire w20.

The first touch wires w10 and the second touch wires 20 may be substantially disposed outside the touch sense area TA. In other embodiments, the first and second touch wires w10, w20 may not be disposed outside the touch sense area TA. For example, at least a part of the first and second touch wires w10 and w20 may be disposed inside the touch sense area TA.

The first touch electrode 151a and the second touch electrode 152a may be formed in a mesh shape. As shown in FIG. 7, the mesh-shaped portions of the first touch electrodes 151a and the second touch electrodes 152a may surround the emission diodes ED, and may not overlap the emission diodes ED in the plan view.

The first touch conductor TEa and the second touch conductor TEb may include a metal such as silver (Ag), aluminum (Al), copper (Cu), molybdenum (Mo), chromium (Cr), nickel (Ni), titanium (Ti), and the like, or an alloy thereof, and may be provided as a plurality of multilayers of such a plurality of metallic, materials (e.g., Ti/Al/Ti), or as single layers. According to another exemplary embodiment, the first touch conductor TEa and the second touch conductor TEb may include a conductive nanomaterial such as a silver nanowire, a carbon nanotube, and the like. Locations of layers of the first touch conductor TEa and the second touch conductor TEb in the cross-sectional view may be switched with each other.

The fourth conductive layer or the fifth conductive layer may include the above-described first crack detection lines TCDa and TCDb. In FIG. 5 and FIG. 6, the first crack detection lines TCDa and TCDb may be exemplarily disposed in the fourth conductive layer.

As previously described, the first crack detection lines TCDa and TCDb can detect a defect such as whether a crack occurs in the encapsulation layer 380 or whether a layer of the encapsulation layer 380 is lifted. For example, the first crack detection lines TCDa and TCDb may be disposed closer to the encapsulation layer 380 than the second crack detection lines MCDa and MCDb. Further, the first crack detection lines TCDa and TCDb may be disposed above the encapsulation layer 380. Accordingly, the first crack detection lines TCDa and TCDb may accurately and sensitively detect a defect such as a crack, lifting, and the like in the encapsulation layer 380. Thus, a risk of erroneously determining if the encapsulation layer 380 is defective or if it is likely that a defect would occur in an element at the periphery of the encapsulation layer 380 may be reduced. In addition, the second crack detection lines MCDa and MCDb can detect a defect that can occur in a layer below the encapsulation layer 380, such as a crack, lifting, and the like. Therefore, according to one or more exemplary embodiments of the present inventive concept, accuracy of detecting a defect in the display panel, such as a crack and the like, may be increased.

Figure 5:
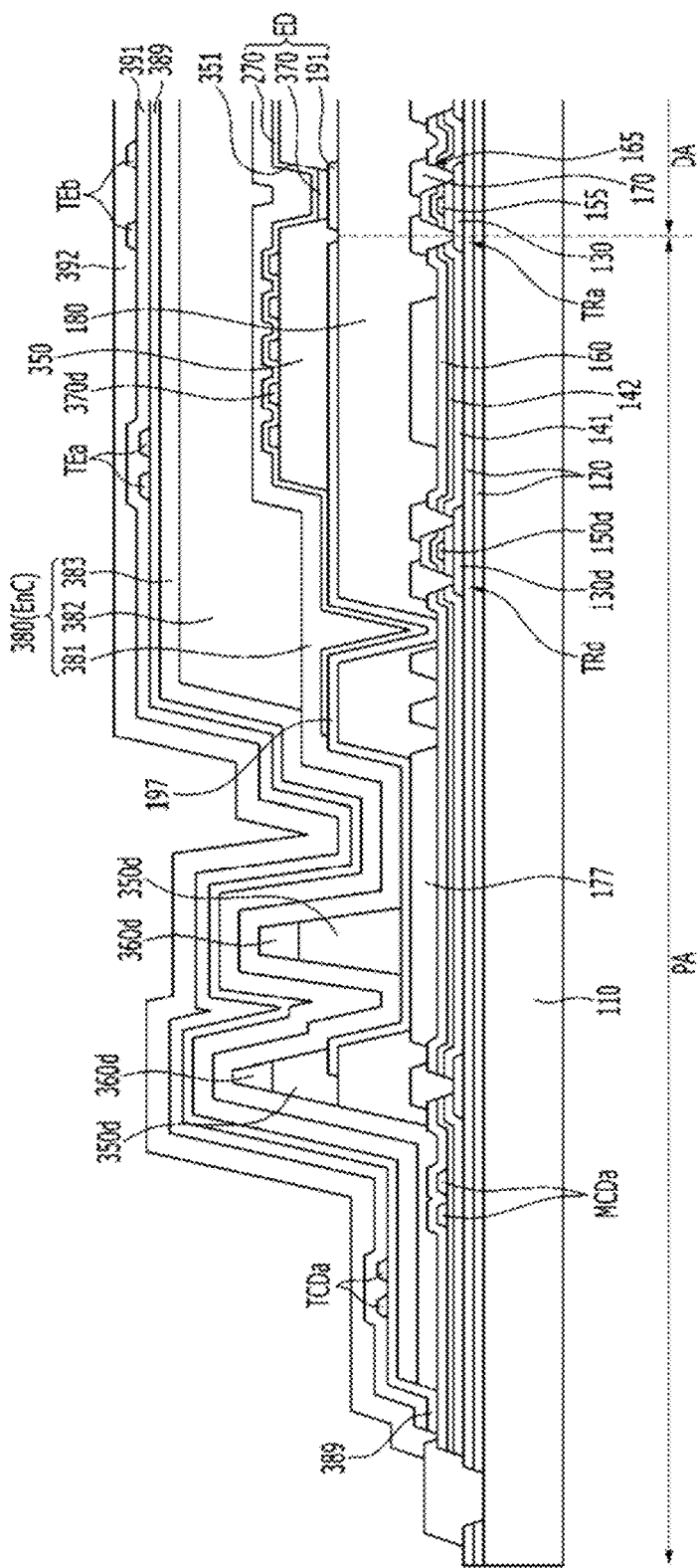
FIG. 5 and FIG. 6 are cross-sectional views of the display device of FIG. 4, taken along the line V-Va according to one or more exemplary embodiments of the present inventive concept.

Referring to FIG. 4 and FIG. 5, the first crack detection lines TCDa and TCDb may be disposed between the dam portion 350d and an edge of the substrate 110. Alternatively, the first crack detection lines TCDa and TCDb may be disposed between an edge of the substrate 110 and the second crack detection lines MCDa and MCDb, but this is not restrictive. In another embodiment, the first crack detection lines TCDa and TCDb may include portions that may overlap at least a portion of the second crack detection lines MCDa and MCDb in the plan view.

Figure 6:
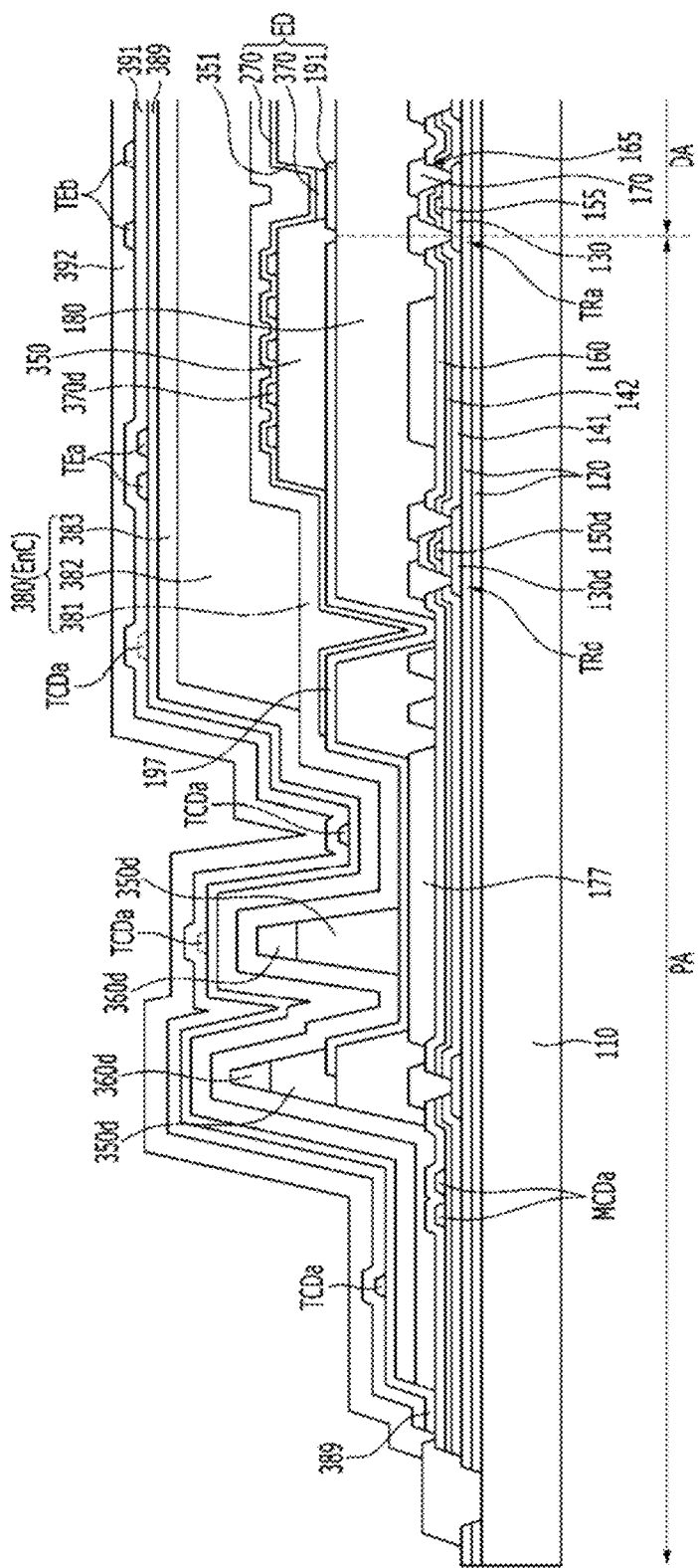

Referring to FIG. 4 to FIG. 6, at least a portion of the first crack detection lines TCDa and TCDb may be disposed between the dam portion 350d and the display area DA. For example, in FIG. 6, it is exemplarily illustrated that the first crack detection line TCDa is partially disposed outside the dam portion 350d, and are partially disposed between the dam portion 350d and the display area DA. Alternatively, as marked by the dotted line in FIG. 6, the first crack detection lines TCDa and TCDb may include portions that are disposed on the dam portion 350d and portions that are disposed on the organic layer 382 of the encapsulation layer 380.

Figure 8:
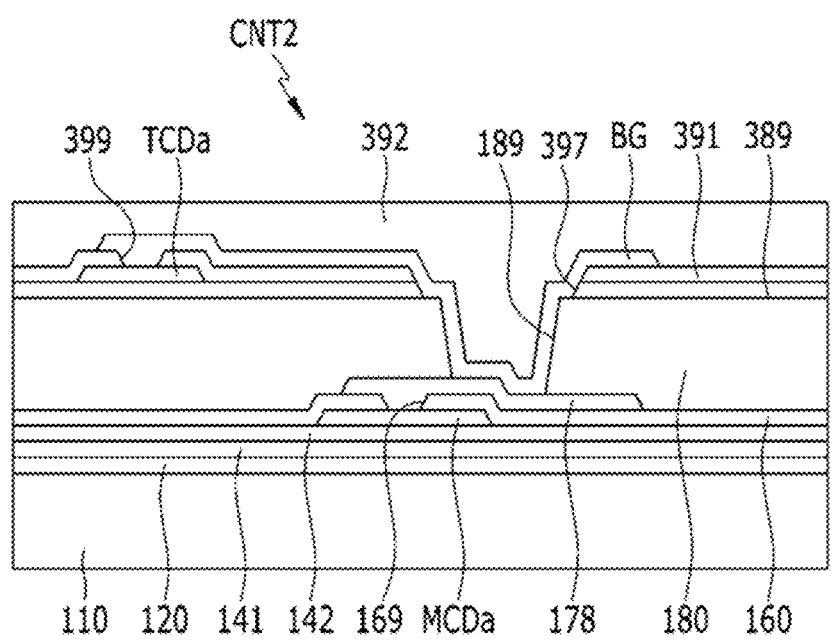
FIG. 8 is a cross-sectional view of the display device of FIG. 4, taken along the line VIII-VIIIa according to an exemplary embodiment of the present inventive concept.

Hereinafter, a detailed structure of the above-described contact portions CNT1, CNT2, CNT3, and CNT4 will be described with reference to FIG. 4 to FIG. 8. FIG. 8 representatively illustrates the contact portion CNT2 that may connect the first crack detection line TCDa and the second crack detection line MCDa with each other, In the contact portion CNT2, the third insulation layer 160 may include a contact hole 169 that may be formed on the second crack detection line MCDa. A conductor 178 that is connected with the second crack detection line MCDa through the contact hole 169 may be further disposed on the third insulation layer 160. The conductor 178 may be disposed in the above-described third conductive layer. The passivation layer 180 may further include a contact hole 189 that is formed on the conductor 178. A buffer layer 389 and a first touch insulation layer 391 that are disposed on the passivation layer 180 may include a contact hole 397 that may overlap the contact hole 189 of the passivation layer 180 when viewed in a direction perpendicular to the surface of the substrate 110. For example, the contact hole 397 may include an edge that surrounds the periphery of the contact hole 189 of the passivation layer 180 when viewed in a direction perpendicular to the surface of the substrate 110, and may have a wider area than the contact hole 189. When the first crack detection line TCDa is disposed in the fourth conductive layer, the first touch insulation layer 391 may include a contact hole 399 that is formed on the first crack detection line TCDa. A connection member BG may be connected with the first crack detection line TCDa through the contact hole 399, and may be connected with the conductor 178 through the contact holes 189 and 397. The connection member BG may be disposed on the first touch insulation layer 391. The connection member BG may be disposed in a fifth conductive layer where the second touch conductor TEb is disposed.

As described, in the contact portion CNT2, the second crack detection line MCDa may be electrically connected with the first crack detection line TCDa through the conductor 178 and the connection member BG.

Next, an example of a detailed structure of the pixel PX included in a display device according to an exemplary embodiment of the present inventive concept will be described with reference to FIG. 9 and FIG. 10, together with the above-described FIG. 1 to FIG. 8. The description of elements that have been previously described above may be omitted.

Figure 9:
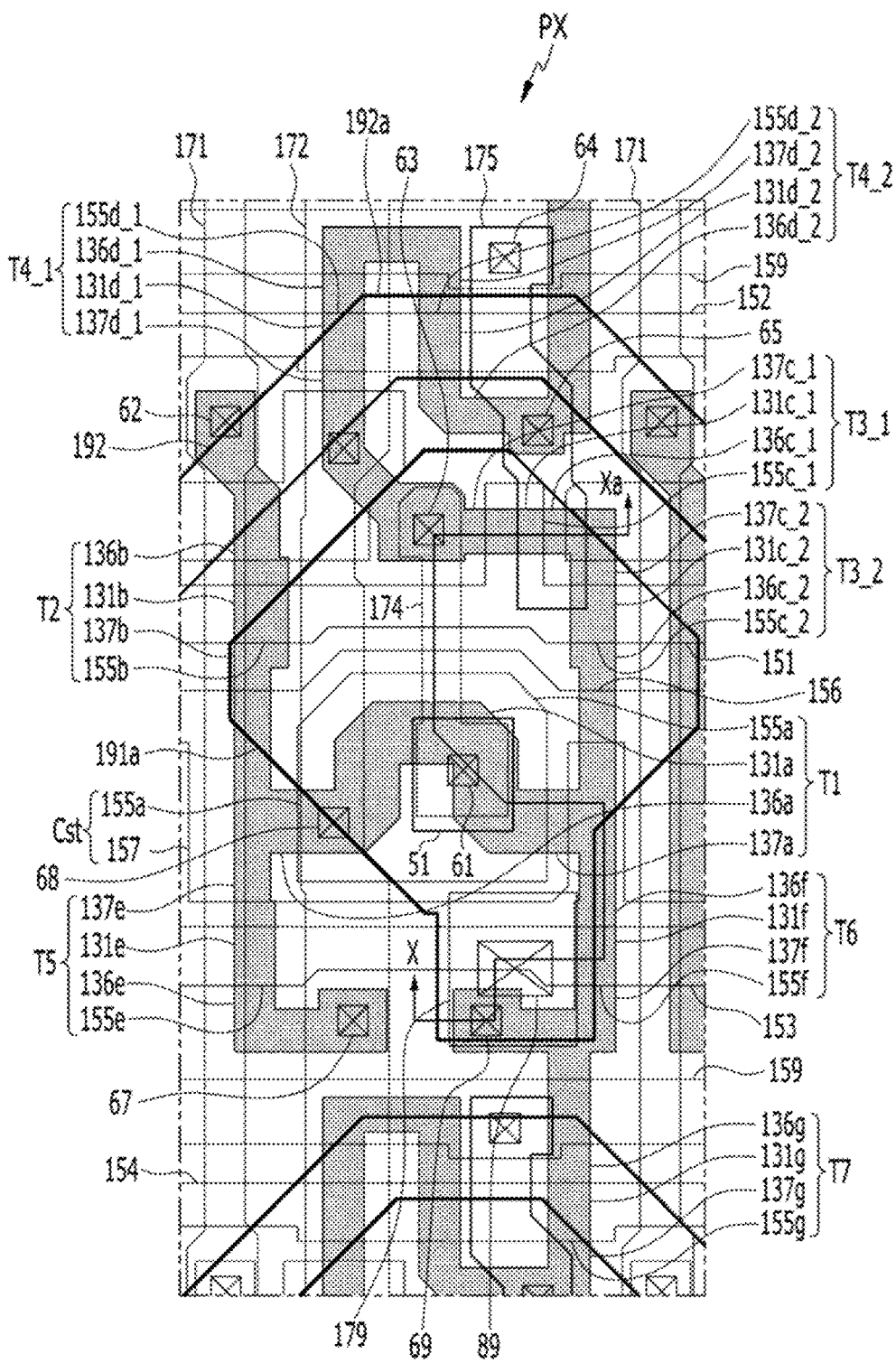
FIG. 9 is a planar layout view of a pixel of a display device according to an exemplary embodiment of the present inventive concept.

First, referring to FIG. 9, a plurality of pixels PX included in a display device according to an exemplary embodiment of the present inventive concept may be red pixels R, green pixels G, or blue pixels B. The display device according to the present exemplary embodiment of the present inventive concept may include a first scan line 151 that transmits a first scan signal, a second scan line 152 that transmits a second scan signal, a third scan line 154 that transmits a third scan signal, and a control line 153 that transmits a light emission control signal. The plurality of scan lines 151, 152, and 154 and the control line 153 may be included in the above-described gate lines 121, and may be included in the above-described first conductive layer in the cross-sectional view.

The display device according to one or more exemplary embodiments of the present inventive concept may further include a storage line 156 and an initialization voltage line 159, and the storage line 156 and the initialization voltage line 159 may be included in the above-described second conductive layer. The storage line 156 may include an expansion portion 157 that is disposed in each pixel PX. The initialization voltage line 159 may transmit an initialization voltage.

The display device according to an exemplary embodiment of the present inventive concept may further include data lines 171 and driving voltage lines 172, and the data lines 171 and the driving voltage lines 172 may be included in the above-described third conductive layer. The data lines 171 and the driving voltage lines 172 may substantially extend in the same direction (for example, a vertical direction in FIG. 9) in the plan view, and may cross the plurality of scan lines 151, 152, and 154. The expansion portion 157 of the storage line 156 may be electrically connected with the driving voltage line 172 through a contact hole 68, and may receive a driving voltage ELVDD.

Each pixel PX may include a plurality of transistors T1, T2, T3_1, T3_2, T4_1, T4_2, T5, T6, and T7 and a capacitor Cst that may be connected with the scan lines 151, 152, and 154, the control line 153, the data line 171, and the driving voltage line 172, and an emission diode ED. The plurality of transistors T1, T2, T3 1, T3_2, T4_1, T4_2, T5, T6, and T7 may correspond to the above-described transistor TRa. A channel of each of the plurality of transistors T1, T2, T3_1, T3_2, T4_1, T4_2, T5, T6, and T7 may be formed in the above-described first active pattern 130. The first active pattern 130 may include channel regions 131a, 131b, 131c_1, 131c_2, 131d_1, 131d_2, 131e, 131f, and 131g, and conductive regions. The channel regions 131a, 131b, 131c_1, 131c_2, 131d_1, 131d_2, 131e, 131f, and 131g may respectively form channels of the respective transistors T1, T2, T3_1, T3_2, T4_1, T4_2, T5, T6, and T7. The conductive regions of the first active pattern 130 may be disposed at lateral sides of each of the channel regions 131a, 131b, 131c_1, 131c_2, 131d_1, 131d_2, 131e, 131f, and 131g and may have higher carrier concentrations than those of the channel regions 131a, 131b, 131c_1, 131c_2, 131d_1, 131d_2, 131e, 131f, and 131g. A pair of conductive regions that are disposed at lateral sides of each of the channel regions 131a, 131b, 131c_1, 131c_2, 131d_1, 131d_2, 131e, 131f, and 131g of the transistors T1, T2, T3_1, T3_2, T4_1, T4_2, T5, T6, and T7 may be the source regions and drain regions of the corresponding transistors T1, T2, T3_1, T3_2, T4_1, T4_2, T5, T6, and T7, and may serve as source electrodes and drain electrodes, respectively.

The first transistor T1 may include the channel region 131a, a source region 136a, a drain region 137a, and a driving gate electrode 155a that may overlap the channel region 131a in the plan view. The driving gate electrode 155a may be included in the above-described first conductive layer, and may be connected with a connection member 174 through a contact hole 61 as shown in FIG. 10. The connection member 174 may be included in the above-described third conductive layer in the cross-sectional view. The contact hole 61 may be disposed in a contact hole 51 that is included in the expansion portion 157.

The second transistor T2 may include the channel region 131b, a source region 136b, a drain region 137b, and a gate electrode 155b that may overlap the channel region 131b in the plan view. The gate electrode 155b may be a part of the first scan line 151. The source region 136b may be connected with the data line 171 through a contact hole 62, and the drain region 137b may be connected with the source region 136a of the first transistor T1.

The third transistors T3_1 and T3_2 may include an upper third transistor T3_1 and a lower third transistor T3_2 that may be connected with each other. The upper third transistor T3_1 may include the channel region 131c_1, a source region 136c_1, a drain region 137c_1, and a gate electrode 155c_1 that may overlap the channel region 131c_1. The gate electrode 155c_1 may be a part of the first scan line 151. The drain region 137c_1 may be connected with the connection member 174 through a contact hole 63. The lower third transistor T3_2 may include the channel region 131c_2, a source region 136c_2, a drain region 137c_2, and a gate electrode 155c_2 that may overlap the channel region 131c_2. The gate electrode 155c_2 may be a part of the first scan line 151.

The fourth transistors T4_1 and T4_2 may include a left fourth transistor T4_1 and a right fourth transistor T4_2 that may be connected with each other. The left fourth transistor T4_1 may include the channel region 131d_1, a source region 136d_1, a drain region 137d_1, and a gate electrode 155d_1 that may overlap the channel region 131d_1. The gate electrode 155d_1 may be a part of the second scan line 152. The drain region 137d_1 may be connected with the drain region 137c_1 of the upper third transistor T3_1, and may be connected with the connection member 174 through the contact hole 63. The right fourth transistor T4_2 may include the channel region 131d_2, a source region 136d_2, a drain region 137d_2, and a gate electrode 155d_2 that may overlap the channel region 131d_2. The gate electrode 155d_2 may be a part of the second scan line 152. The drain region 137d_2 may be connected with the source region 136d_1 of the left fourth transistor T4_1, and the source region 136*d*_2 may be connected with a connection member 175 through a contact hole 65.

The connection member 175 may be included in the above-described second conductive layer or the third conductive layer. When the connection member 175 is included in the third conductive layer, the connection member 175 may be electrically connected with the initialization voltage line 159 through a contact hole 64.

The fifth transistor T5 may include the channel region 131*e*, a source region 136*e*, a drain region 137*e*, and a gate electrode 155*e* that may overlap the channel region 131*e*. The gate electrode 155*e* may be a part of the control line 153. The source region 136*e* may be connected with the driving voltage line 172 through a contact hole 67, and the drain region 137*e* may be connected with the source region 136*a* of the first transistor T1.

The sixth transistor T6 includes the channel region 131*f*, a source region 136*f*, a drain region 137*f*, and a gate electrode 155*f* that may overlap the channel region 131*f*. The gate electrode 155*f* may be a part of the control line 153. The source region 136*f* may be connected with the drain region 137*a* of the first transistor T1, and the drain region 137*f* of the sixth transistor T6 may be connected with a connection member 179 through a contact hole 69. The connection member 179 may be included in the third conductive layer in the cross-sectional view.

The seventh transistor T7 may include the channel region 131*g*, a source region 136*g*, a drain region 137*g*, and a gate electrode 155*g* that may overlap the channel region 131*g*. The gate electrode 155*g* may be a part of the third scan line 154. The source region 136*g* may be connected with the drain region 137*f* of the sixth transistor T6, and the drain region 137*g* may be connected with the connection member 175 through the contact hole 65 and thus receives an initialization voltage.

The transistors T1, T2, T3_1, T3_2, T4_1, T4_2, T5, T6, and T7 may be P-type transistors. Alternatively, at least one of the transistors T1, T2, T3_1, T3_2, T4_1, T4_2, T5, T6, and T7 may be an N-type transistor.

The capacitor Cst may include the driving gate electrode 155*a* and the expansion portion 157 of the storage line 156 as two terminals, which may overlap each other while interposing the second insulation layer 142.

The above-described pixel electrode layer may include the pixel electrode 191 and a pixel conductive pattern 192. The pixel electrode 191 may be connected with a connection member 179 through a contact hole 89 and receives a data voltage. The pixel conductive pattern 192 may be bent along an edge of the pixel electrode 191 that is adjacent thereto. The pixel conductive pattern 192 may transmit the initialization voltage.

Figure 10:
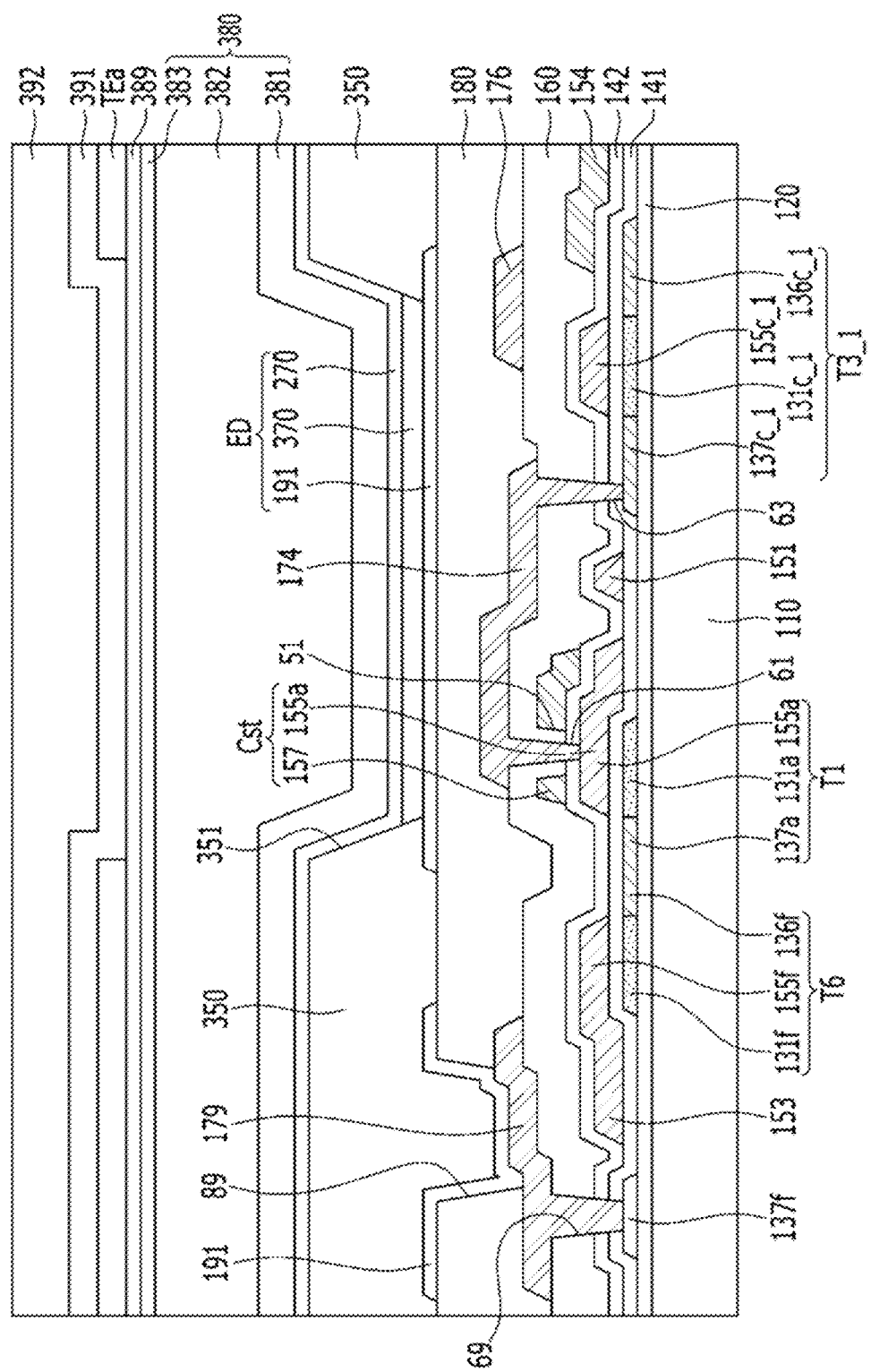
FIG. 10 is a cross-sectional view of the display device of FIG. 9, taken along the line X-Xa according to an exemplary embodiment of the present inventive concept.

A description of constituent elements shown in FIG. 9 and FIG. 10 may be the same as the description provided above, and therefore no detailed description will be provided.

Next, a method for detecting a defect such as a crack in a display device according to an exemplary embodiment of the present inventive concept will he described with reference to the above-described FIG. 4.

A test voltage may be applied to a test signal line TD1 through a pad portion PDA and connection wires CL1 and CL2. In this case, when a gate signal of a gate-on voltage is also applied to a test gate line TG, switches Q1 and Q2 of a crack detection circuit CDA may be turned on. Then, the test voltage applied to the test signal line TD1 may be applied to a data line 171 through the turned-on switch Q2. The test voltage may be a predetermined voltage, and may be, for example, a voltage for displaying a lowest gray in the pixels R, G, and B. In this case, the test voltage may be about 7 V. Thus, the pixels R, G, and B that are connected with the turned-on switch Q2 may display a low gray such as a black color.

In case no crack or lifting occurs in a peripheral area PA and no corresponding damage is applied to first crack detection lines TCDa and TCDb and second crack detection lines MCDa and MCDb to put the first crack detection lines TCDa and TCDb and the second crack detection lines MCDa and MCDb in a normal state, a voltage applied to a test signal line TD2 of the crack detection circuit CDA through a crack detection route of the first crack detection lines TCDa and TCDb and second crack detection lines MCDa and MCDb from the test voltage applied from the pad portion PDA may be substantially the same as a voltage applied to the test signal line TD1. For this, matching resistors R1 and R2 may be controlled. Accordingly, the pixels R, G, and B that are connected with the switch Q1 may display a predetermined gray such as a black color, which may be substantially same gray for the pixels R, G, and B that are connected with the switch Q2.

However, when a crack or lifting occurs in the peripheral area PA of the display panel 1000 and thus the first crack detection lines TCDa and TCDb and/or the second crack detection lines MCDa and MCDb are short-circuited or damaged, the wire resistance may increase. As a result, a black data voltage may not be able to be applied to the pixels G that may be connected with the switch Q1, or a sufficient black data voltage cannot be applied thereto. Accordingly, a strong or weak bright line may be viewed along a column of the pixels G that are connected with the switch Q1. Therefore, the defect such as a crack or lifting that may occur in the peripheral area PA of the display panel 1000 may be detected from the bright light from the display panel 1000.

When a pixel array connected with the switch Q1 is a first pixel array including only green pixels G, bright green line may be viewed when a defect such as a crack occurs in the peripheral area PA. When the first crack detection lines TCDa and TCDb and the second crack detection lines MCDa and MCDb are respectively disposed in the left side peripheral area PA and the right side peripheral area PA, a bright green line extending in the vertical direction on the display area DA may be seen. Further, the location of the bright green line may teach the location of the defect in the peripheral area PA. For example, in case the defect occurs in the left peripheral area PA, the bright green line may be viewed in the left half portion of the display area DA. In case the defect occurs in the right peripheral area PA, the bright green line may be viewed in the right half portion of the display area DA.

Next, a display device according to an exemplary embodiment will be described with reference to FIG. 11 to FIG. 18, together with the above-described drawings.

Figure 11:
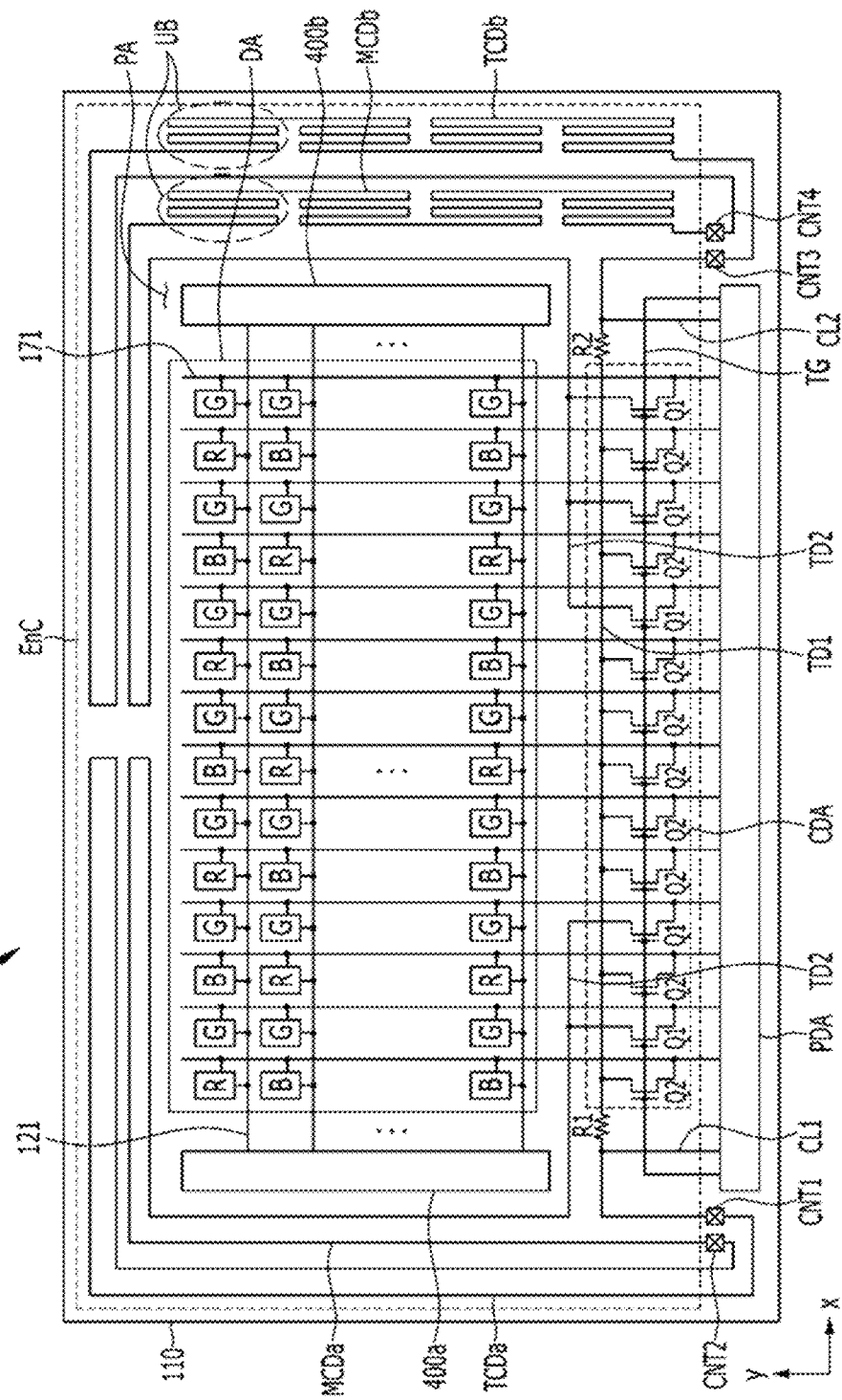
FIG. 11 to FIG. 19 are top plan views of display panels of display devices according to one or more exemplary embodiments of the present inventive concept.

First, referring to FIG. 11, a display device according an exemplary embodiment of the present inventive concept is almost the same as the display device of the above-described exemplary embodiment, except that at least one of the first crack detection lines TCDa and TCDb and the second crack detection lines MCDa and MCDb may include a plurality of blocks UB, and each of the plurality of block UB may include bent portions that may be formed by the first crack detection lines TCDa and TCDb or the second crack detection lines MCDa and MCDb, extending in the back and forth direction to form the bent portions. As described, when the first crack detection lines TCDa and TCDb and the second crack detection lines MCDa and MCDb include the plurality of blocks UB, wire resistance of the crack detection route may be increased.

In one embodiment, as shown in FIG. 11, the plurality of blocks UB may be positioned to the right portion of the substrate 1000, where the first crack detection line TCDb and the second crack detection line MCDb include the plurality of blocks UB. On the other hand, the location of the plurality of blocks UB is not limited. In another embodiment, the first crack detection line TCDb and the second crack detection line MCDb including the plurality of blocks UB may be disposed in the left portion of the substrate 1000. In still another embodiment, only a portion of the first crack detection lines TCDa and TCDb and the second crack detection lines MCDa and MCDb may include the plurality of blocks UB. As described, wire resistance of the first crack detection lines TCDa and TCDb and the second crack detection lines MCDa and MCDb may be controlled to increase sensitivity for detecting the defect such as a crack.

Figure 12:
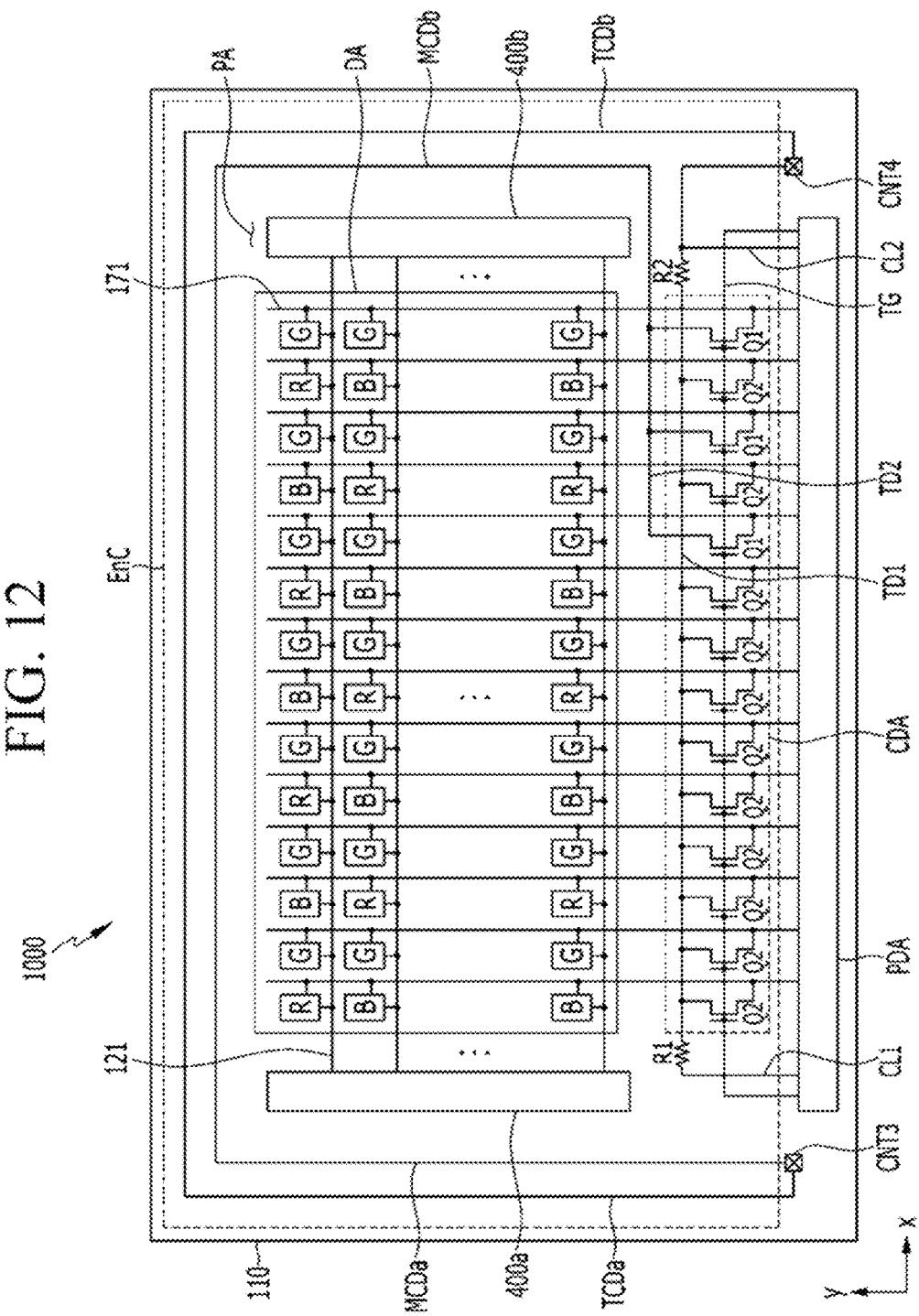

Next, referring to FIG. 12, a display device according to an exemplary embodiment of the present inventive concept is almost the same as the display device of the above-described exemplary embodiment, except for arrangements or shapes of first crack detection lines TCDa and TCDb and second crack detection lines MCDa and MCDb. For example, the first crack detection lines TCDa and TCDb may be connected with each other in the upper side peripheral area PA, and thus may form one single wire that may substantially extend along the longitudinal direction of the display area DA. The second crack detection lines MCDa and MCDb may be connected with each other in the upper side peripheral area PA, and thus may form one single wire that may extend along the display area DA.

One end of each of the first crack detection lines TCDa and TCDb and one end of each of the second crack detection lines MCDa and MCDb may be connected with each other through a contact portion CNT3 in one peripheral area PA (for example, the left side peripheral area PA). The other end of the first crack detection lines TCDa and TCDb may be connected to the test signal line TD1 through a contact portion CNT4 in the opposite peripheral area PA (for example, the right side peripheral area PA). The other end of the second crack detection lines MCDa and MCDb may be connected with the test signal line TD2 only in one side of the display panel 1000. For example, as shown in FIG. 12, the test signal line TD2 may be disposed only in the right peripheral area PA of the display panel 1000.

As described above, the first crack detection lines TCDa and TCDb and the second crack detection lines MCDa and MCDb may be connected with each other to form one crack detection route. The crack detection route may be one connected line, and may end at a point connected with the test signal line TD2 after being extended at least once along the right, top, and left peripheries of the display area DA from the contact portion CNT4. The first crack detection lines TCDa and TCDb of the crack detection route may receive a test voltage from a pad portion PDA through the contact portion CNT4 that may be disposed in one side of the display panel 1000.

According to an exemplary embodiment of the present inventive concept, areas occupied by the first crack detection lines TCDa and TCDb and the second crack detection lines MCDa and MCDb in the peripheral area PA may be reduced, thereby further reducing the area of the peripheral area PA.

Figure 13:
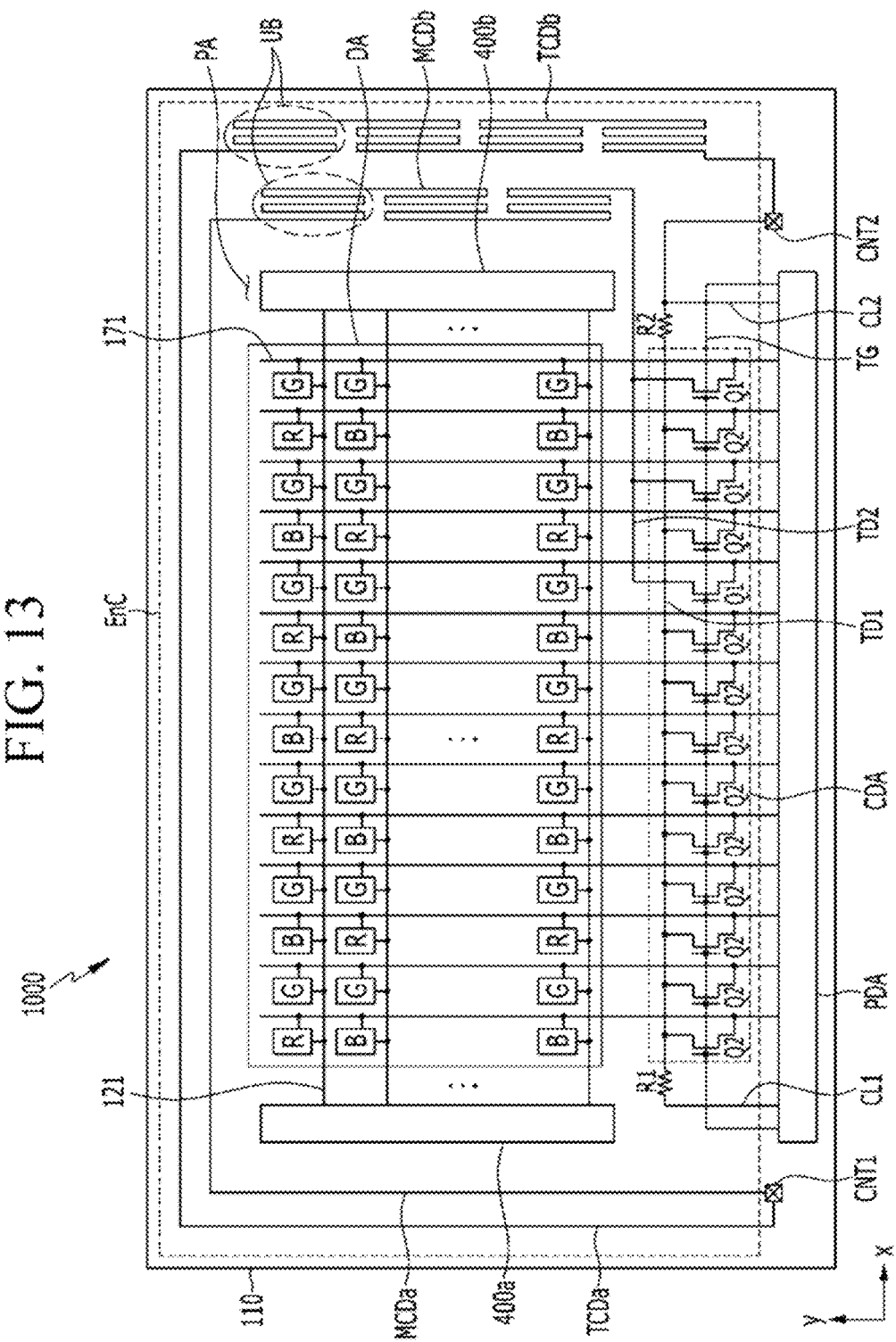

Referring to FIG. 13, a display device according to an exemplary embodiment of the present inventive concept is almost the same as the above-described display device of FIG. 12, except that at least one of the first crack detection lines TCDa and TCDb and the second crack detection lines MCDa and MCDb may include several blocks UB as previously shown in the exemplary embodiment of FIG. 11, and each block may include bent portions formed by extending the first crack detection lines TCDa and TCDb or the second crack detection lines MCDa and MCDb in the back and forth direction multiple times. As described, the first crack detection lines TCDa and TCDb and the second crack detection lines MCDa and MCDb can increase wire resistance of a crack detection route by including the plurality of blocks UB.

FIG. 13 exemplarily illustrates that the first crack detection line TCDb and the second crack detection line MCDb, including a plurality of blocks UB, may be disposed in the right side peripheral area PA. In another embodiment, the first crack detection line TCDb and the second crack detection line MCDb, including the plurality of blocks UB, may be disposed in the left side peripheral area PA. In still another embodiment, a portion of the first crack detection lines TCDa and TCDb and the second crack detection lines MCDa and MCDb may include a plurality of blocks UB.

Figure 14:
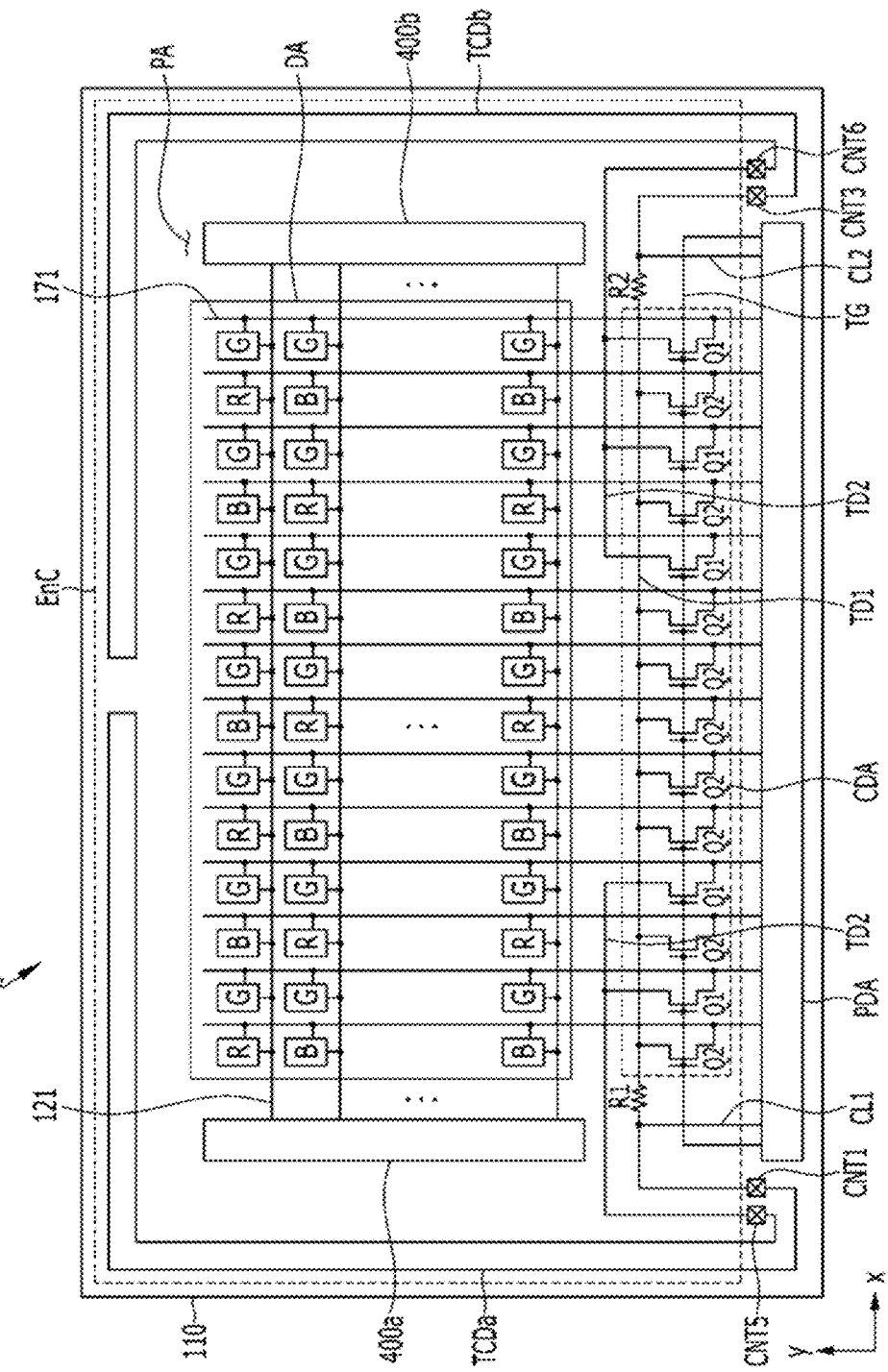

Next, referring to FIG. 14, a display device according to an exemplary embodiment of the present inventive concept is almost the same as the display device of the exemplary embodiment of FIG. 4, except that second crack detection lines MCDa and MCDb may be omitted in FIG. 14. In FIG. 14, one end of each of the first crack detection lines TCDa and TCDb may be connected with a detection data line TD1 of a crack detection circuit CDA through contact portions CNT1 and CNT3, respectively, and the other end may be connected with a test signal line TD2 through contact portions CNT5 and CNT6, respectively. That is, the first crack detection line TCDa disposed in the left side peripheral area PA may form a crack detection route that ends at the contact portion CNT5 by extending the first crack detection line TCDa in the back and forth direction at least once along the left and the top portion of the display area DA starting from the contact portion CNT1. The first crack detection line TCDb disposed in the right side peripheral area PA may form the crack detection route that may end at the contact portion CNT6 by extending the first crack detection line TCDb in the back and forth direction at least once along the right and the top side peripheral area PA starting from the contact portion CNT3 that receives the test voltage.

In one embodiment, the contact portions CNT1, CNT3, CNT5, and CNT6 may be disposed in locations where the contact portions CNT1, CNT3, CNT5, and CNT6 do not overlap an encapsulation layer EnC in the plan view.

According to the present exemplary embodiment, a defect may be detected through the first crack detection lines TCDa and TCDb. For example, a crack in an encapsulation layer EnC or lifting of a layer of the encapsulation layer EnC may be detected through the first crack detection lines TCDa and TCDb.

Figure 15:
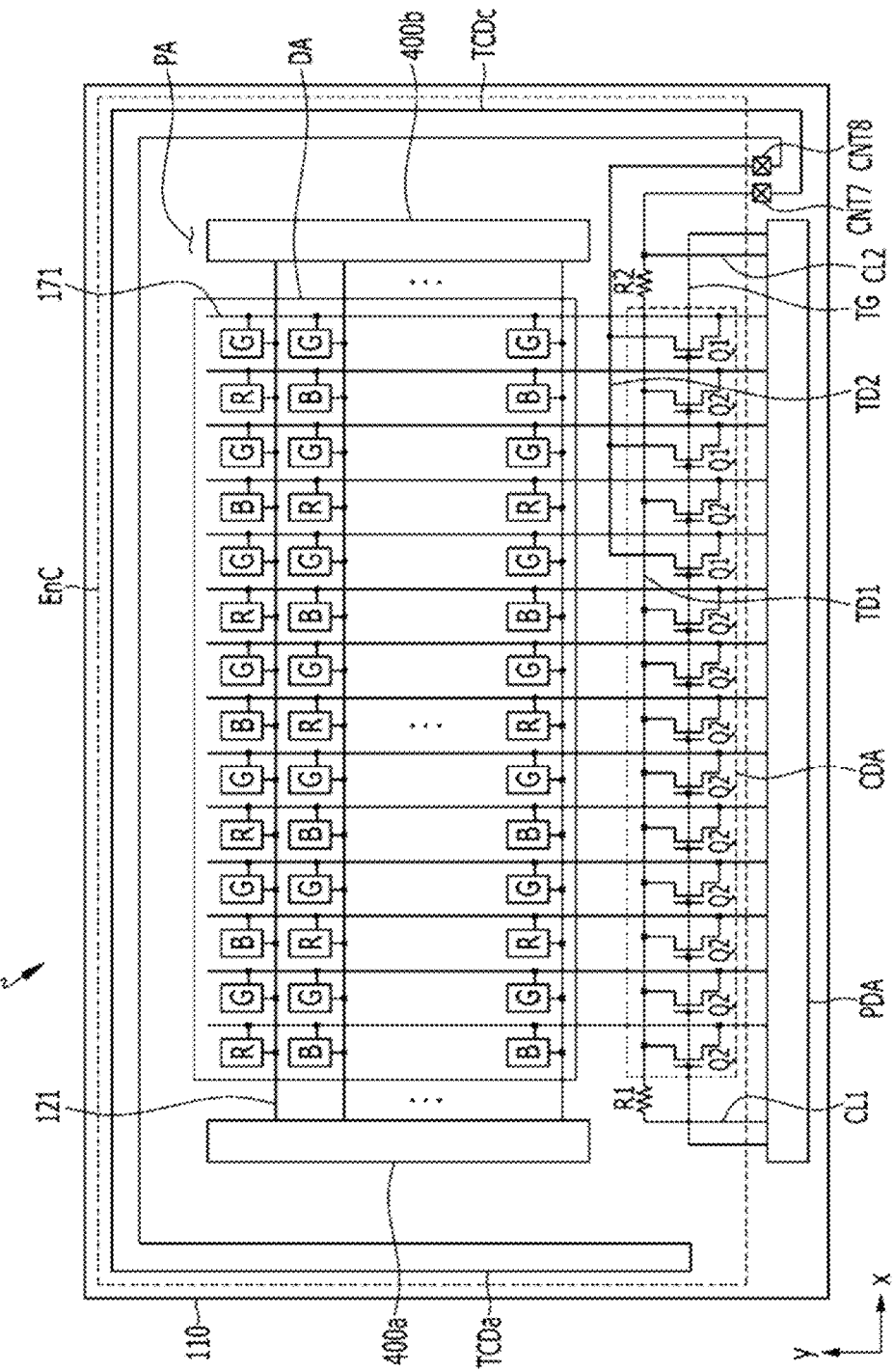

Next, referring to FIG. 15, a display device according to an exemplary embodiment of the present inventive concept is almost the same as the display device of the exemplary embodiment of FIG. 12, except that second crack detection lines MCDa and MCDb are omitted in FIG. 15, as previously omitted in the exemplary embodiment of FIG. 14, and one crack detection line TCDc is included. One end of the first crack detection line TCDc may be connected with a detection data line TD1 of a crack detection circuit CDA through a contact portion CNT7, and the other end may be connected with a test signal line TD2 through a contact portion CNT8. The first crack detection line TCDc may form the crack detection route that may end at the contact portion CNT8 by extending the first crack detection line TCDc in the back and forth direction at least once along the right, top, and left side peripheral areas PA, starting from a contact portion CNT7 that receives a test voltage.

Figure 16:
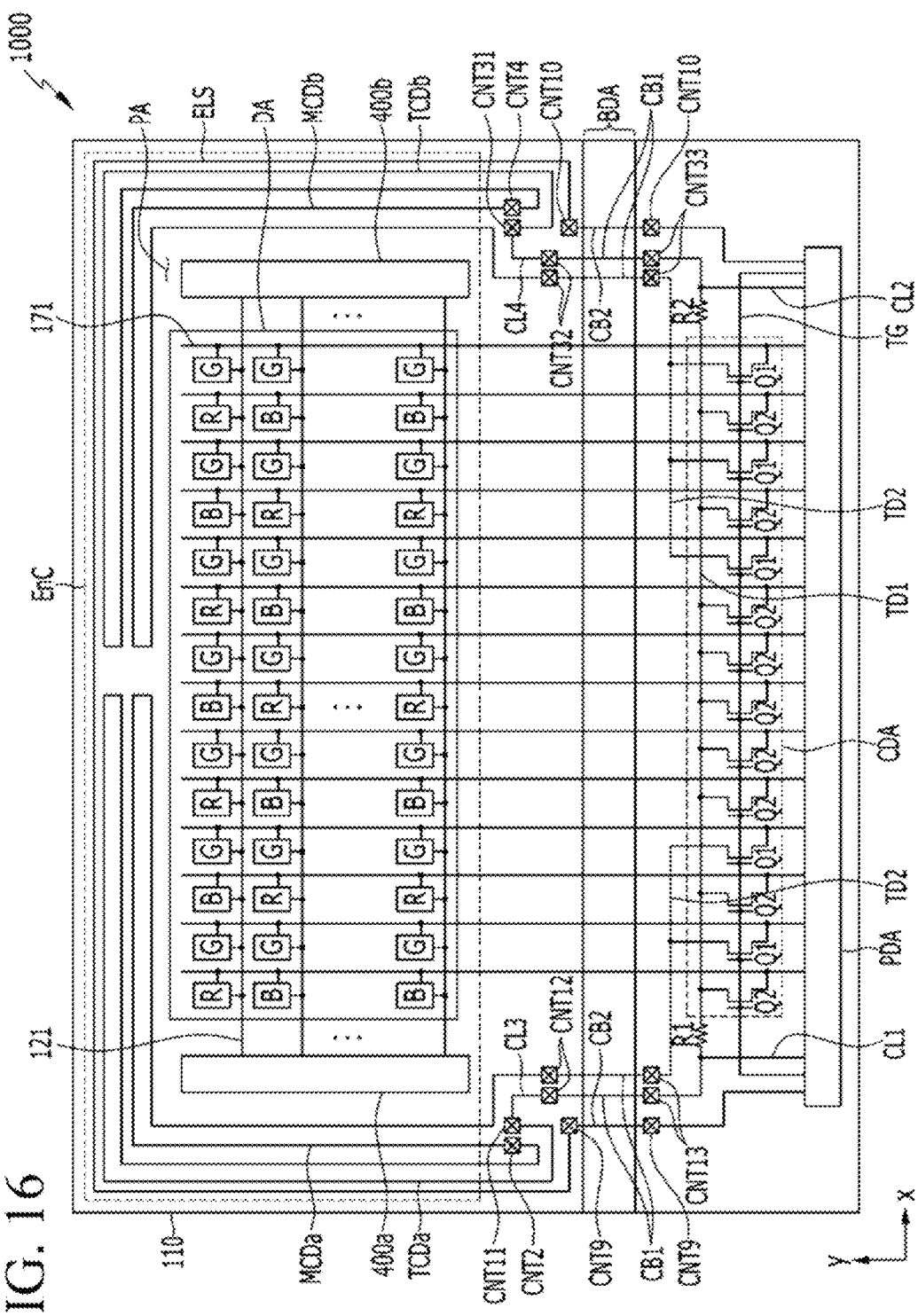

Next, referring to FIG. 16, a display device according to an exemplary embodiment of the present inventive concept includes a bending area BDA as in the above-described exemplary embodiment of FIG. 1. A crack detection circuit CDA may be disposed between the bending area BDA and a pad portion PDA. As shown, the first crack detection lines TCDa and TCDb and second crack detection lines MCDa and MCDb may be disposed outside the periphery of the display area DA, and may further include portions that may overlap the bending area BDA when viewed in a direction perpendicular to the surface of the substrate. In this case, the first crack detection lines TCDa and TCDb and the second crack detection lines MCDa and MCDb may be connected to a test signal line TD2. In addition, the first crack detection lines TCDa and TCDb and the second crack detection lines MCDa and MCDb may be connected to the connection wires CL1 and CL2, respectively, through contact portions CNT12, CNT13, and CNT32, CNT33, respectively. The contact portions CNT12, CNT13, CNT32, and CNT33 may be disposed outside the periphery of the bending area BDA.

The first crack detection lines TCDa and TCDb may respectively further include connection wires CL3 and CL4 that are respectively connected between contact portions CNT11 and CND31 and the contact portions CNT12 and CNT32. The first crack detection lines TCDa and TCDb and the second crack detection lines MCDa and MCDb may respectively further include connection wires CB1 that may connect the contact portion CNT12 with the contact portion CNT13, and/or the contact portion CNT32 with the contact portion CNT33. The contact portions CNT12 and CNT32 may be disposed outside the upper periphery of the bending area BDA, and the contact portions CNT13 and CNT33 may be disposed outside the lower periphery of the bending area BDA. Each connection wire CB1 may be connected to a test signal TD1 and the test signal line TD2 of the crack detection circuit CDA through the contact portions CNT13 and CNT33. Accordingly, one of the first crack detection lines TCDa and TCDb may receive a test voltage from the pad portion. PDA through one of the connection wires CL1 and CL2, one of the contact portions CNT12/CNT13 and CNT32/CNT33, one of the connection wires CL3 and CL4, and one of the contact portions CNT11 and CNT31, respectively.

As described, the contact portions CNT12, CNT13, CNT32, and CNT33 may be disposed outside the periphery of the bending area BDA, and may include at least one contact hole. Further, wires of different layers may be connected with each other through the respective contact portions CNT12, CNT13, CNT32, and CNT33. For example, the connection wire CB1 may be disposed in the above-described third conductive layer. In other examples, the connection wires CL3 and CL4 that may be connected with each other through the contact portions CNT12, CNT13, CNT32, and CNT33, the second crack detection lines MCDa and MCDb, and the test signal lines TD1 and TD2 may be disposed in the above-described second conductive layer or the first conductive layer.

In addition, the display panel 1000 according to an exemplary embodiment of the present inventive concept may further include a common voltage transmission line ELS that extends along the peripheral area PA around at least three sides of the display area DA and transmits a common voltage. The common voltage transmission line ELS may further include connection wires CB2 that may overlap the bending area BDA when viewed in a direction perpendicular to the surface of the substrate, and may receive the common voltage from the pad portion PDA through the connection wire CB2. The connection wires CB2 may be respectively connected to contact portions CNT9 and CNT10 that may be disposed outside the periphery of the bending are BDA. Wires of different layers may be connected with each other through the contact portions CNT9 and CNT10.

Figure 17:
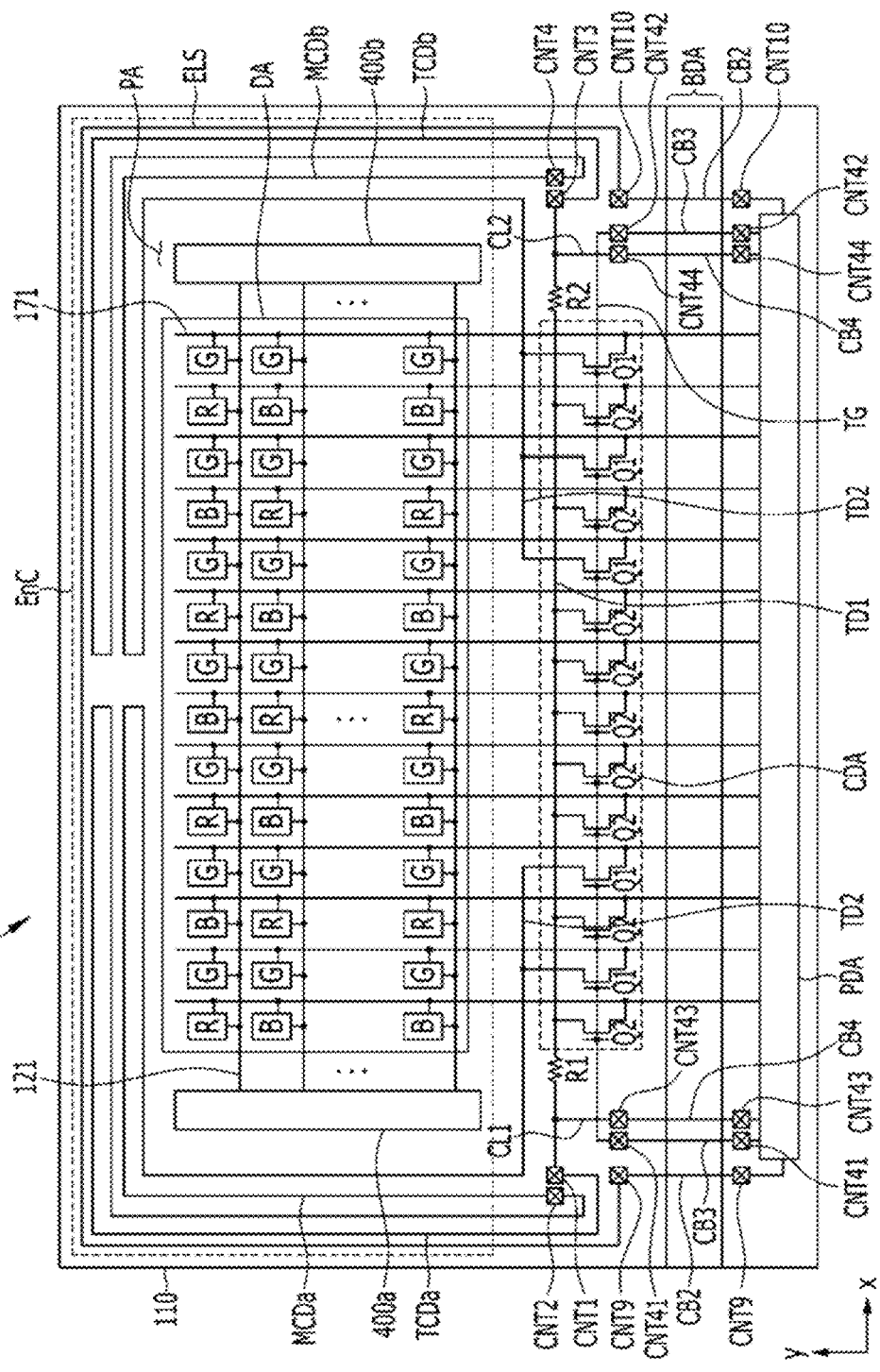

Next, referring to FIG. 17, a display device according to an exemplary embodiment of the present inventive concept is almost the same as the display device of the exemplary embodiment of FIG. 16, except that the crack detection circuit CDA and the test signal line TD2 may be disposed between the bending area BDA and the display area DA. In this case, a test gate line TG may further include a connection wire CB3 that may connect two contact portions CNT41 and two contact portions CNT42 that may be disposed outside the periphery of the bending area BDA. The connection wire CB3 may be disposed to overlap the bending area BDA when viewed in a direction perpendicular to the surface of the substrate. Wires of different layers may be connected with each other through the contact portions CNT41 and CNT42.

Likewise, connection wires CL1 and CL2 connecting the test signal line TD1 with the pad portion PDA may include connection wires CB4 that may be connecting two contact portions CNT43 and two contact portions CNT44 that may be disposed outside the periphery of the bending area BDA. The connection wires CB4 may be disposed to overlap the bending area BDA when viewed in a direction perpendicular to the surface of the substrate. Wires of different layers may be connected with each other through the contact portions CNT43 and CNT44.

Figure 18:
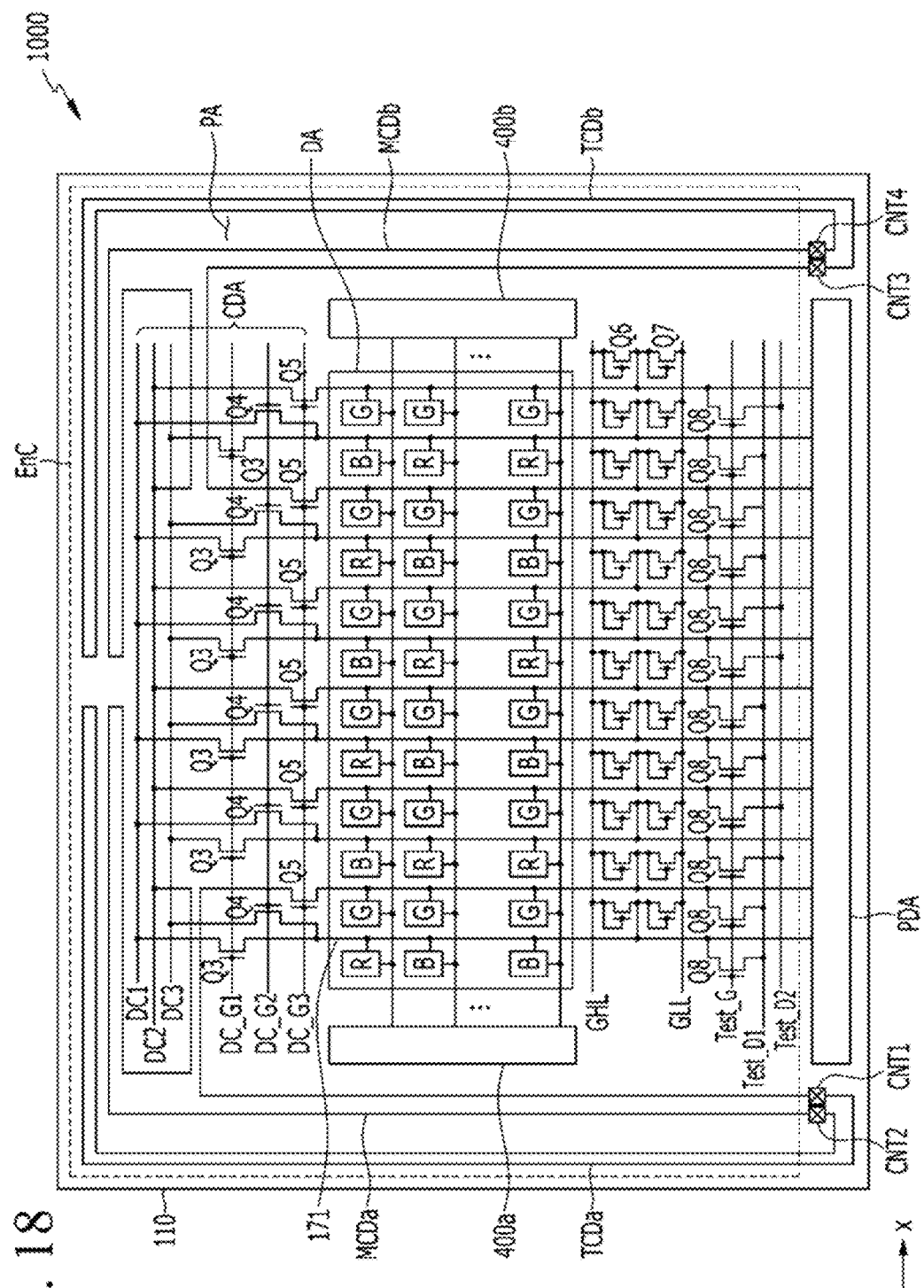

Next, referring to FIG. 18, a display device according to an exemplary embodiment of the present inventive concept is almost the same as the display device of the exemplary embodiment of FIG. 4, except for a configuration and a location of a crack detection circuit CDA.

The crack detection circuit CDA may include a plurality of test signal lines DC1, DC2, and DC3, a plurality of test gate lines DC_G1, DC_G2, and DC_G3, and a plurality of switches Q3, Q4, and Q5. The plurality of test signal lines DC1, DC2, and DC3 and the plurality of test gate lines DC_G1, DC_G2 and DC_G3 may respectively extend in the x-axis direction, and may be disposed substantially in parallel with one another. The plurality of test signal lines DC1, DC2, and DC3 and the plurality of test gate lines DC_G1, DC_G2, and DC_G3 may be connected with a pad portion PDA and receive signals.

Each of the switches Q3 may include a gate terminal connected to the test gate line DC_G1, an input terminal connected to one of a pair of test signal lines DC1 and DC3, and an output terminal that is connected to a corresponding data line 171. Each of the switches Q4 may include a gate terminal connected to the test gate line DC_G2, an input terminal connected to test signals DC1 and DC3 that may not he shared by the switch Q3, and an output terminal connected to a corresponding data line 171. Each of the switches Q5 may include a gate terminal connected to the test gate line DC_G3, an input terminal connected to the test signal line DC2, and an output terminal connected to a corresponding data line 171. When a first pixel array with only green pixels G and a second pixel array with red pixels R and blue pixels B alternately arranged are arranged alternately in the x-axis direction in a display area DA, a data line 171 connected to the first pixel array may be connected to the test signal line DC2 through the switches Q5, and a data line 171 connected to the second pixel array may be connected to the pair of test signal lines DC1 and DC3 through each pair of switches Q3 and Q4.

The plurality of switches Q3, Q4, and Q5 may be alternately arranged in such an order in the x-axis direction.

As shown in FIG. 18, one end of each of first crack detection lines TCDa and TCDb may be connected with at least one switch Q5, and one end of each of second crack detection lines MCDa and MCDb may be connected with the test signal line DC2 through the contact portions CNT2 and CNT4, respectively. For example, one crack detection route including one of the first crack detection lines TCDa and TCDb and corresponding one of the second crack detection lines MCDa and MCDb may be connected with at least one switch Q5 and the test signal line DC2. FIG. 18 exemplarily illustrates that the switch Q5 may be connected to the test signal line DC2 through the first crack detection line TCDa and the second crack detection line MCDa, and the first crack detection line TCDb and the second crack detection line MCDb, respectively, in each of the left side peripheral area and the right side peripheral area of the display panel 1000.

Referring to FIG. 18, the display panel 1000 may further include a plurality of test signal lines Test_D1 and Test_D2, a test gate line Test_G, and a plurality of switches Q8. The plurality of test signal lines Test_D1 and Test_D2 and the plurality of test gate lines Test_G may respectively extend in the x-axis direction and may be disposed in parallel with one another.

Each of the plurality of switches Q8 may be arranged to correspond to each data line 171. Each switch Q8 may include a gate terminal connected to the test gate line Test_G, an input terminal connected to one of the test signal lines Test_D1 and Test_D2, and an output terminal connected to a corresponding data line 171. A first pair of adjacent switches Q8 may be connected to the test signal line Test_D1, and a second pair of adjacent switches Q8 may be connected to the test signal line Test_D2. The first pair of adjacent switches Q8 and the second pair of adjacent switches Q8 may be alternately arranged in the x-axis direction, but this arrangement is not limited. In another embodiment, one of the pair of test signal lines Test_D1 and Test_D2 may be omitted, and all switches Q8 may be connected to one test signal line.

A high voltage line GHL, a low voltage line GLL, and a plurality of switches Q6 and Q7 may further be disposed between a plurality of switches Q8 and the display area DA. The plurality of switches Q6 and Q7 may be connected to the high voltage line GHL and the data line 171, or the low voltage line GLL and the data line 171. Each of the plurality of switches Q6 and each of the plurality of switches Q7 may be diode-connected with each other. In other embodiments, the high voltage line GHL, the low voltage line GLL, and the switches Q6 and Q7 may be omitted.

In the exemplary embodiment illustrated in FIG. 18, the crack detection circuit CDA may be disposed in an upper side peripheral area PA, outside the upper portion of the display area DA. In other embodiments, the crack detection circuit CDA may be disposed somewhere else. For example, the crack detection circuit CDA may be disposed between the display area DA and the pad portion PDA. In another example, the crack detection circuit CDA may be disposed in an area that may oppose the pad portion PDA with reference to the display area.

Next, a method for detecting a defect in the display device according to an exemplary embodiment of the present inventive concept will be described with reference to FIG. 18.

First, a first test voltage may be applied to the test signal lines Test_D1 and Test_D2, and a gate signal of a gate-on voltage may be applied to the test gate line Test_G. Then, the switches Q8 may be turned on, and the first test voltage may be applied to the plurality of data lines 171 through the turned-on switches Q8. The first test voltage may be a predetermined voltage, and may be, for example, a voltage for pixels R, G, and B to display a highest gray. Accordingly, pixels R, G, and B connected with the turned-on switches Q8 may display a highest gray such as a white color.

Next, when a gate-on voltage is applied to the test gate lines DC_G1, DC_G2, and DC_G3 after a gate-off voltage is applied to the test gate line Test_G, the plurality of switches Q3, Q4, and Q5 may be turned on. In this case, when a second test voltage is applied to the test signal lines DC1, DC2, and DC3, the second test voltage may be applied to the plurality of data lines 171 through the turned-on switches Q3, Q4, and Q5. The second test voltage may be a predetermined voltage, and may be, for example, a voltage for the pixels R, G, and B to display a lowest gray. Accordingly, pixels R, G, and B that are connected with the turned-on switches Q3, Q4, and Q5 that are not connected with the first crack detection lines TCDa and TCDb and the second crack detection lines MCDa and MCDb may display a lowest gray such as a black color.

In case no crack or lifting occurs in a peripheral area PA of the display panel 1000, and no damage is applied to the first crack detection lines TCDa and TCDb and the second crack detection lines MCDa and MCDb, the first crack detection lines TCDa and TCDb and the second crack detection lines MCDa and MCDb may be in a normal state. The switches Q5 may be connected with the first crack detection lines TCDa and TCDb and the second crack detection lines MCDa and MCDb, and the pixels G may display a lowest gray such as a black color.

However, when the crack or lifting occurs in the peripheral area PA of the display panel 1000 and thus the first crack detection lines TCDa and TCDb and/or the second crack detection lines MCDa and MCDb are short-circuited or damaged, wire resistance may increase. As described above, the switches Q5 may be connected with the first crack detection lines TCDa and TCDb and the second crack detection lines MCDa and MCDb, and when the wire resistance increases, the pixels G connected with the switches Q5 may not be applied with a black data voltage or cannot be applied with a sufficient black data voltage. Accordingly, a strong or weak bright line may be viewed along an array of the pixels G that are connected with the switches Q5, which, in turn, may be connected with the defective first crack detection lines TCDa and TCDb and/or second crack detection lines MCDa and MCDb. The defect such as a crack or lifting that may occur in the peripheral area P of the display panel 1000 may be detected from the bright light from the display panel 1000.

Next, a display device according to an exemplary embodiment of the present inventive concept will be described with reference to FIG. 19 and FIG. 20, together with the above-described drawings.

Figure 19:
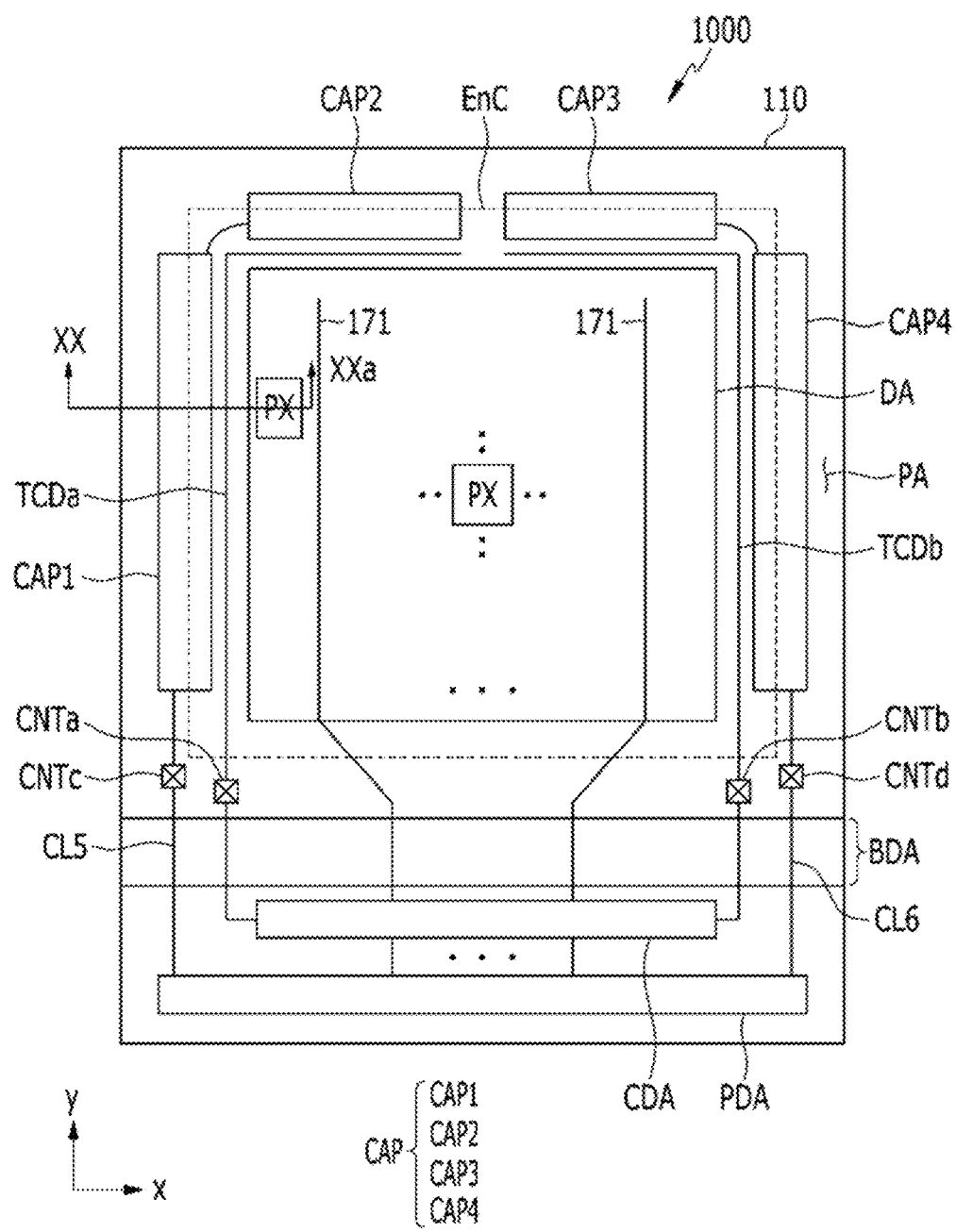
Figure 20:
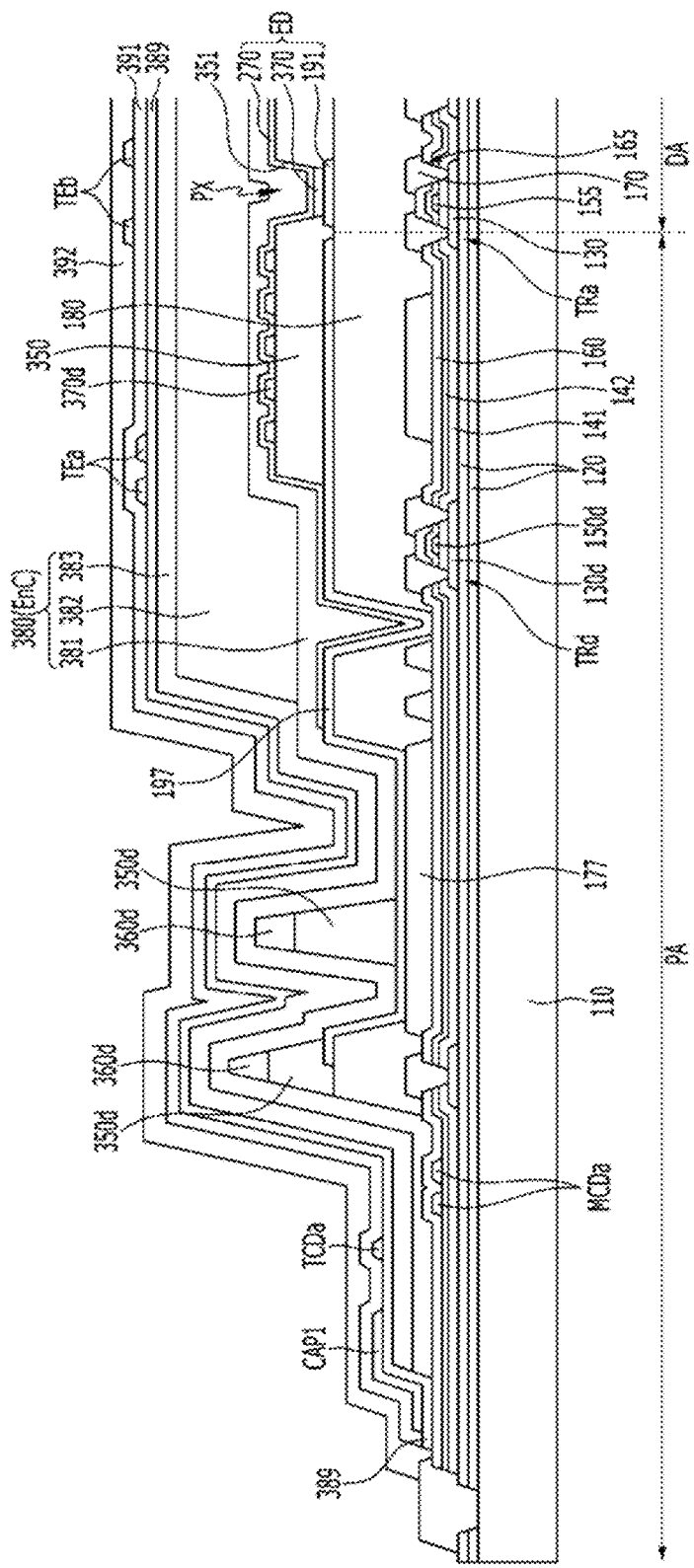
FIG. 20 is a cross-sectional view of the display device of FIG. 19, taken along the line XX-XXa according to an exemplary embodiment of the present inventive concept.

Referring to FIG. 19 and FIG. 20, a display device according to one or more exemplary embodiments of the present inventive concept is almost the same as the display device of the above-described embodiment, except that the display device further includes a capping layer CAP that may be disposed in the peripheral area PA outside the periphery of the display area DA. The capping layer CAP may include a portion that extends along an edge of an encapsulation layer EnC while covering the edge of the encapsulation layer EnC.

For example, the capping layer CAP may include at least one capping portion CPA1 that may be disposed in a left side peripheral area PA of the substrate 1000 and extends while overlapping the left edge of the encapsulation layer EnC. At least one capping portions CAP2 and CAP3 may be disposed in the upper side peripheral area PA, and may extend while overlapping an upper edge of the encapsulation layer EnC. At least one capping portion CAP4 may be disposed in a right side peripheral area PA of the substrate 1000, and may extend while overlapping the right edge of the encapsulation layer EnC. In other embodiments, each of the two capping portions CAP1 and CAP4 may include a plurality of separated portions, and the capping portions CPA2 and CAP3 may be connected with each other.

Referring to FIG. 20, the capping layer CAP may include the capping portions CAP1, CAP2, CAP3, and CAP4 overlapping the edges of the encapsulation layer EnC. Accordingly, a crack occurring from an edge of the substrate 110 may be prevented from being spread to the encapsulation layer EnC and layers at the periphery of the encapsulation layer EnC.

The capping layer CAP may be disposed in the fourth conductive layer where the above-described first touch conductor TEa is disposed. In another exemplary embodiment, the capping layer CAP may be disposed in the fifth conductive layer where the second touch conductor TEb is disposed. According to another exemplary embodiment, the capping layer CAP may include both of the fourth conductive layer and the fifth conductive layer.

Referring back to FIG. 19, the capping layer CAP may be connected with the pad portion PDA and thus may transmit a predetermined voltage such as a common voltage and the like. When the display panel 1000 includes a bending area BDA, the capping layer CAP may be connected with the pad portion PAD through at least one of the contact portions CNTc and CNTd and at least one of the connection wires CL5 and CL6 that may be disposed to overlap the bending area BDA when viewed in a direction perpendicular to the surface of the substrate. While not illustrated in FIG. 19, the connection wires CL5 and CL6 may be connected with the pad portion PDA through a contact portion (not shown) that is disposed outside or at the lower periphery of the bending area BDA.

According to another exemplary embodiment, the capping layer CAP may prevent the cracks from occurring in one or more exemplary embodiments of the present inventive concept as shown in FIG. 19 and FIG. 20. Therefore, at least one of the first crack detection lines TCDa and TCDb and the second crack detection lines MCDa and MCDb may be omitted.

A display device according to an exemplary embodiment of the present inventive concept will now be described with reference to FIG. 21, together with the above-described drawings.

Figure 21:
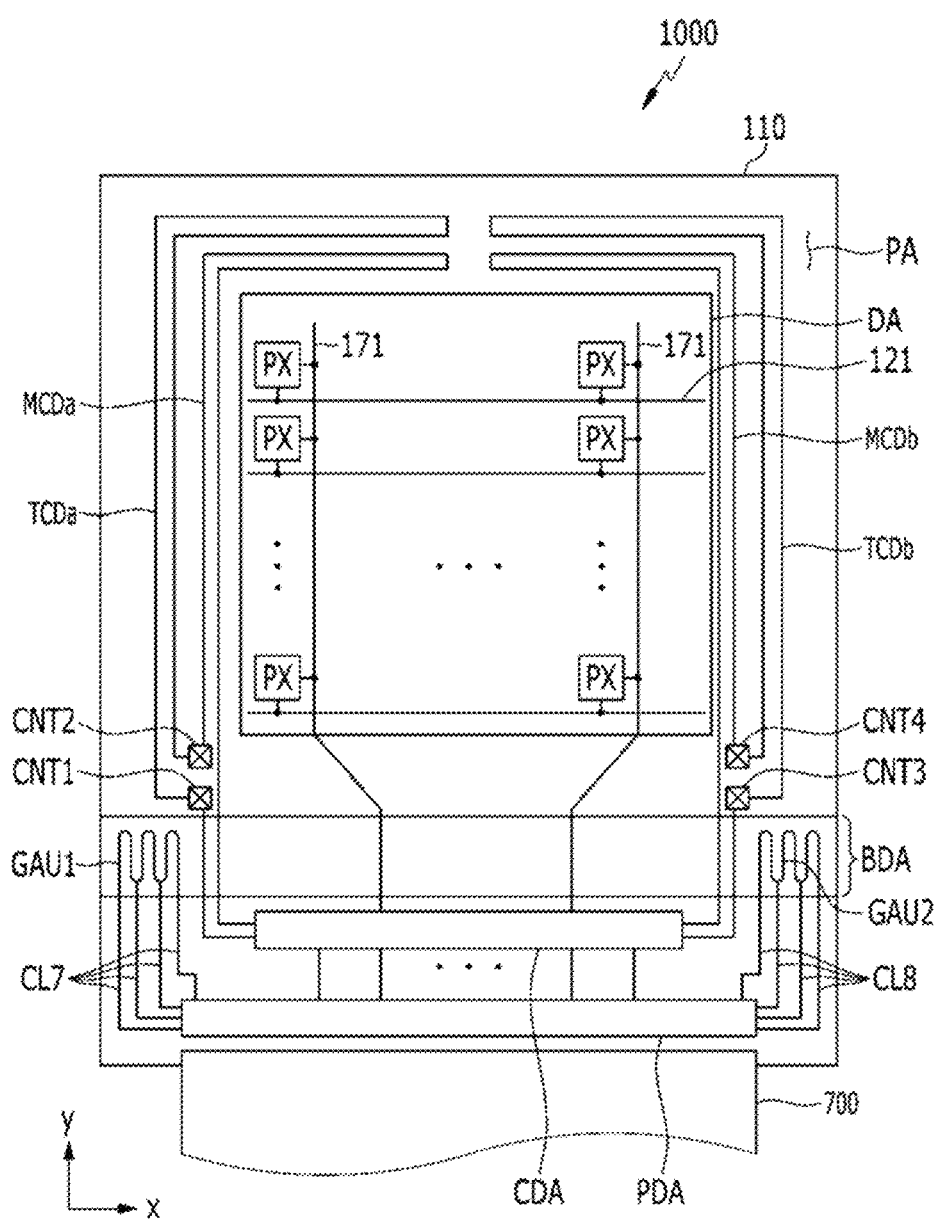
FIG. 21 is a top plan view of a display panel included in a display device according to an exemplary embodiment of the present inventive concept.

Referring to FIG. 21, a display device according to an exemplary embodiment of the present inventive concept is almost the same as the display device of the above-described exemplary embodiment, except that the display device may further include strain gauges GAU1 and GAU2 that may include resistor lines disposed in a bending area BDA. The resistor lines of the strain gauges GAU1 and GAU2 may be disposed in the end regions of the bending area BDA. For example, as shown in FIG. 21, the resistor lines may be disposed in the left and/or right end regions of the bending area BDA. Resistance of the resistor lines of the strain gauges GAU1 and GAU2 may vary depending on the degree of bending of the bending area BDA, and the corresponding stress applied to the bending area BDA may be detected by sensing the resistance change.

The resistor lines of the strain gauges GAU1 and GAU2 may include bent portions of the resistor lines formed by extending in the back and forth direction in the bending area BDA, and may be connected to a pad portion PDA through a plurality of connection wires CL7 and CL8. The connection wires CL7 and CL8 may be respectively connected to other portions of the resistor lines of the strain gauges GAU1 and GAU2.

The resistor lines of the strain gauges GAU1 and GAU2 may be disposed at the same layer as one of the above-described first, second, and third conductive layers.

Referring to FIG. 21, the display device according to an exemplary embodiment of the present inventive concept may further include a printed circuit film 700 that is connected with a display panel 1000. A plurality of signal wires may be disposed in the printed circuit film 700, and at least one driver, a timing controller, and the like may be installed in the printed circuit film 700. The signal wires of the printed circuit film 700 may be connected with the pad portion PDA of the display panel 1000.

In another embodiment, the printed circuit film 700 may include a pad portion (not shown) that may be electrically connected with the pad portion PDA while overlapping the pad portion PDA.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a display area including a plurality of pixel electrodes and data lines, and disposed on the substrate;
   a peripheral area disposed outside the display area of the substrate;
   a pad portion disposed in the peripheral area;
   an encapsulation layer disposed on at least one of the peripheral area and the display area and disposed over the plurality of pixel electrodes;
   a crack detection circuit disposed in the peripheral area; and
   a first crack detection line disposed in the peripheral area, and connected with the pad portion and the crack detection circuit,
   wherein:
   the encapsulation layer comprises an organic layer and an inorganic layer,
   the first crack detection line is disposed on the encapsulation layer and overlaps the inorganic layer, but does not overlap the organic layer of the encapsulation layer in a plan view.

2. The display device of claim 1, further comprising a first test signal line extending in a first direction in the peripheral area,
   wherein a first end of the first crack detection line and the first test signal line are connected with the pad portion.

3. The display device of claim 2, wherein the first end of the first crack detection line is connected with the pad portion through a first contact portion, and the first contact portion does not overlap the encapsulation layer.

4. The display device of claim 2, further comprising a second test signal line that extends in the first direction in the peripheral area,
 wherein a second end of the first crack detection line is connected with the second test signal line.

5. The display device of claim 4, wherein the second end of the first crack detection line is connected with the second test signal line through a second contact portion, the second contact portion not overlapping the encapsulation layer.

6. The display device of claim 4, wherein the crack detection circuit comprises;
 a first switch comprising an input terminal connected with the first test signal line, and an output terminal connected with a first data line among a plurality of data lines, and
 a second switch comprising an input terminal connected with the second test signal line, and an output terminal connected with a second data line among the plurality of the data lines.

7. The display device of claim 6, further comprising a matching resistor connecting the first test signal line and the pad portion.

8. The display device of claim 6, wherein the second data line is connected with pixels representing a first color among the plurality of pixels.

9. The display device of claim 1, further comprising a second crack detection line disposed in the peripheral area,
 wherein the second crack detection line is connected with the first crack detection line, and is disposed under the encapsulation layer.

10. The display device of claim 9, further comprising a first test signal line and a second test signal line extending in a first direction in the peripheral area,
 wherein the crack detection circuit comprises a first switch and a second switch,
 the first switch comprises an input terminal connected with the first test signal line, and an output terminal connected with a first data line among a plurality of data lines,
 the second switch comprises an input terminal connected with the second test signal line, and an output terminal connected with a second data line among the plurality of the data lines,
 a first end of the first crack detection line and a first end of the second crack detection line are connected with each other through a first contact portion, and
 a second end of the first crack detection line is connected with the pad portion through a second contact portion, and a second end of the second crack detection line is connected with the second test signal line.

11. The display device of claim 10, wherein the first contact portion and the second contact portion do not overlap the encapsulation layer.

12. The display device of claim 10, wherein the second data line is connected with pixels representing a first color among the plurality of pixels.

13. The display device according to claim 10, wherein the first crack detection line is bent a plurality of times in the peripheral area around the display area before connecting to the first contact portion.

14. The display device of claim 1, further comprising a dam portion disposed in the peripheral area, wherein the first crack detection line comprises at least one of a portion that is disposed between the dam portion and an edge of the substrate, a portion that is disposed between the dam portion and the display area, and a portion that is disposed on the dam portion.

15. The display device of claim 1, further comprising a plurality of touch conductors that are disposed on the encapsulation layer,
 wherein the first crack detection line is disposed at a same layer as the touch conductors.

16. The display device of claim 1, wherein the first crack detection line comprises a plurality of blocks that are connected with each other, and
 each of the plurality of blocks comprises a bent portion formed by the first crack detection line extending in the back and forth direction multiple times.

17. The display device of claim 1, wherein the first crack detection line comprises a portion that extends around a first side and a second side of the display area.

18. The display device of claim 1, wherein the first crack detection line comprises a portion that extends around a first side, a second side, and a third side of the display area.

19. The display device of claim 1, further comprising a bending area that is disposed in the peripheral area and is bendable or in a bent state,
 wherein the crack detection circuit is disposed in at least one of an area between the bending area and the display area, an area between the bending area and the pad portion, and an area that opposes the pad portion with reference to the display area.

20. The display device of claim 19, further comprising a strain gauge that includes a resistor line disposed in the bending area.

21. The display device of claim 1, wherein the crack detection circuit is disposed in an area that opposes the pad portion with reference to the display area.

22. A display device comprising:
 a substrate;
 a display area including a plurality of pixels and data lines and disposed on the substrate;
 a peripheral area disposed outside the display area of the substrate;
 an encapsulation layer disposed in the peripheral area and the display area, and disposed on the plurality of pixels of the display area of the substrate;
 a first crack detection line disposed on the encapsulation layer; and
 a second crack detection line disposed under the encapsulation layer,
 wherein the first crack detection line and the second crack detection line are electrically connected with each other, and
 wherein a shape of the first crack detection line in a plan view is substantially different from a shape of the second crack detection line in the plan view.

23. The display device of claim 22, further comprising a crack detection circuit disposed in the peripheral area,
 wherein the crack detection circuit comprises a first switch that is connected with one end of the first crack detection line, and a second switch that is connected with one end of the second crack detection line.

24. The display device of claim 23, further comprising a matching resistor that is connected with one end of the first crack detection line.

25. The display device according to claim 22, wherein:
 the first crack detection line and the second crack detection line are electrically connected with each other through a contact portion, the contact portion comprises a conductor disposed on the second crack detection line and a connection member electrically connected to the first crack detection line and the conductor.

* * * * *